United States Patent
Dangelo et al.

(10) Patent No.: US 6,324,678 B1
(45) Date of Patent: *Nov. 27, 2001

(54) METHOD AND SYSTEM FOR CREATING AND VALIDATING LOW LEVEL DESCRIPTION OF ELECTRONIC DESIGN

(75) Inventors: Carlos Dangelo, Los Gatos; Richard Deeley, San Jose; Vijay Nagasamy, Union City; Manoucher Vafai, Los Gatos, all of CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 08/701,727

(22) Filed: Aug. 22, 1996

Related U.S. Application Data

(63) Continuation of application No. 08/077,403, filed on Jun. 14, 1993, now Pat. No. 5,553,002, which is a continuation-in-part of application No. 08/077,294, filed on Jun. 14, 1993, now Pat. No. 5,544,067, which is a continuation-in-part of application No. 08/054,053, filed on Apr. 26, 1993, now abandoned, which is a continuation of application No. 07/507,201, filed on Apr. 6, 1990, now Pat. No. 5,222,030, which is a continuation-in-part of application No. 07/917,801, filed on Jul. 20, 1992, now Pat. No. 5,220,512, which is a continuation of application No. 07/512,129, filed on Apr. 19, 1990, now abandoned.

(51) Int. Cl.$^7$ .................................................. G06F 17/50
(52) U.S. Cl. ................... 716/18; 716/5; 716/7; 716/8; 716/11
(58) Field of Search .............................. 716/5, 7, 8, 11, 716/18

(56) References Cited

U.S. PATENT DOCUMENTS

| | | | |
|---|---|---|---|
| T940,008 | 11/1975 | Oden | 444/1 |
| T940,020 | 11/1975 | Brechling et al. | 444/1 |

(List continued on next page.)

FOREIGN PATENT DOCUMENTS

| | | | | |
|---|---|---|---|---|
| 0 319 232 A2 | 6/1989 | (EP) | | 15/40 |
| 0 473 960 A2 | 3/1992 | (EP) | | 15/40 |
| 0 463 301 A2 | 1/1992 | (EP) | | 15/60 |

OTHER PUBLICATIONS

"Methods Used in an Automatic Logic Design Generator (Alert)", IEEE Trans. On Computers, vol. C–18, No. 7, Jul. 1969, pp. 593–614.*

(List continued on next page.)

*Primary Examiner*—Vincent N. Trans
*Assistant Examiner*—Hugh Jones

(57) ABSTRACT

A methodology for generating structural descriptions of complex digital devices from high-level descriptions and specifications is disclosed. The methodology uses a systematic technique to map and enforce consistency of the semantics imbedded in the intent of the original, high-level descriptions. The design activity is essentially a series of transformations operating upon various levels of design representations. At each level, the intended meaning (semantics) and formal software manipulations are captured to derive a more detailed level describing hardware meeting the design goals. Important features of the methodology are: capturing the users concepts, intent, specification, descriptions, constraints and trade-offs; architectural partitioning; what-if analysis at a high level; sizing estimation; timing estimation; architectural trade-off; conceptual design with implementation estimation; and timing closure. The methodology includes using estimators, based on data gathered over a number of realized designs, for partitioning and evaluating a design prior to logic synthesis. From the structural description, a physical implementation of the device is readily realized. A matrix of milestones (goals in the design activity) is defined by degree of complexity (level of abstraction) of a design and for progressive stages (levels) of design activity (from concept through implementation). The milestones are defined using continuous refinement, and the design activity proceeds towards subsequent milestones. As milestones are achieved, previous design activity becomes unalterable. A feasibility stage is key to convergence of the process. Single level or multi-level estimators determine the direction of the process.

23 Claims, 18 Drawing Sheets

U.S. PATENT DOCUMENTS

| | | | |
|---|---|---|---|
| 4,353,117 | | 10/1982 | Spellman ............................... 364/300 |
| 4,587,625 | * | 5/1986 | Marino, Jr. et al. .................. 364/578 |
| 4,635,208 | * | 1/1987 | Coleby et al. ........................ 364/491 |
| 4,675,832 | * | 6/1987 | Robinson et al. .................... 364/488 |
| 4,697,241 | * | 9/1987 | Lavi ...................................... 364/488 |
| 4,703,435 | * | 10/1987 | Darringer et al. .................... 364/489 |
| 4,789,944 | * | 12/1988 | Wada et al. ........................... 364/488 |
| 4,805,113 | * | 2/1989 | Ishii et al. ............................. 364/491 |
| 4,813,013 | * | 3/1989 | Dunn ..................................... 364/488 |
| 4,827,427 | * | 5/1989 | Hyduke ................................. 364/488 |
| 4,831,543 | * | 5/1989 | Mastellone ........................... 364/489 |
| 4,833,619 | | 5/1989 | Shimizu et al. ....................... 364/489 |
| 4,890,238 | * | 12/1989 | Klein et al. ........................... 364/491 |
| 4,908,772 | * | 3/1990 | Chi ........................................ 364/491 |
| 4,918,614 | * | 4/1990 | Modarres et al. .................... 364/490 |
| 4,922,432 | | 5/1990 | Kobayashi et al. ................... 364/490 |
| 4,965,741 | * | 10/1990 | Winchell et al. ..................... 364/488 |
| 4,967,367 | * | 10/1990 | Piednoir ................................ 364/489 |
| 4,970,664 | * | 11/1990 | Kaiser et al. ......................... 364/488 |
| 5,005,136 | * | 4/1991 | Van Berkel et al. ................. 364/490 |
| 5,034,899 | * | 7/1991 | Schult ................................... 364/488 |
| 5,084,824 | | 1/1992 | Lam et al. ............................. 364/490 |
| 5,111,413 | * | 5/1992 | Lazansky et al. .................... 364/488 |
| 5,164,908 | * | 11/1992 | Igarashi ................................ 364/491 |
| 5,164,911 | | 11/1992 | Juran et al. ........................... 364/578 |
| 5,220,512 | | 6/1993 | Watkins et al. ....................... 364/489 |
| 5,222,030 | | 6/1993 | Dangelo et al. ...................... 364/489 |
| 5,544,066 | * | 8/1996 | Rostoker et al. ..................... 364/489 |

OTHER PUBLICATIONS

"Partitioning and Placement Technique for CMOS Gate Arrays" by Odawara et al, IEEE Trans. On Computer–Aided Design, vol. CAD–6, No. 3, May 1987, pp. 355–363.*

"Theory and Concepts of Circuit Layout" by Hu et al, IEEE 1985, pp. 3–18.*

"Tango–Schematic Capture Software," *Perx Catalog*, pp. 18 & 19.

"Method Used in an Automatic Logic Design Generator (Alert)", By Friedman et al., *IEEE Transactions On Computers*, vol. C18, No. 7, Jul. 1969, pp. 593–614.

"Quality of Designs from an Automatic Logic Generator (Alert)," By Friedman et al., *IEEE Design Automation Conference*, 1970, pp. 71–80.

"Design Automation," By Russo, *Computer*, May/Jun. 1972, pp. 19–22.

"Computer Aided Design," By Lynn, *Computer*, May/Jun. 1972, pp. 36–45.

"Recent Developments in Design Automation," By Breuer, *Computer*, May/Jun. 1972, pp. 23–35.

"Linda: A Local Interactive Design Aid for Computer–Aided General–Purpose Artwork Production," By Briggs, *GEC Journal of Science & Technology*, vol. 43, No. 2, 1976.

"An Engineering System for Designer, Manager and Manufacturer," By Smith et al., *Telesis*, vol. 4, No. 9, Dec. 1976, pp. 268–273.

"Computer Graphics in Power Plant Design," By Strong et al., *IEEE Power Engineering Society*, Jul. 1978.

"An Automated System to Support Design Analysis," By Willis, 12TH Annual Asilomar Conference on Circuits, Systems & Computers, *IEEE*, Nov. 1978, pp. 646–650.

"Computer–Aided Partitioning of Behavioral Hardware Descriptions," By McFarland, 20TH Design Automation Conference, *IEEE*, 1983, pp. 472–478.

"Definite Clause Translation Grammars," By Abramson, University of British Columbia, *IEEE*, 1984, pp. 233–240.

"Verify: A Program for Proving Correctness of Digital Hardware Designs," By Barrow, *Artificial Intelligence* 24, 1984, pp. 437–483.

"Switch–Level Delay Models for Digital MOS VLSI," By Ousterhout, *IEEE 21st Design Automation Conference*, 1984, pp. 542–548.

"Automated Generation of Digital System Schematic Diagrams," By Arya et al., 22nd Design Automation Conference, *IEEE*, 1985, pp. 388–395.

"Using Bottom–Up Design Techniques in the Synthesis of Digital Hardware from Abstract Behavioral Descriptions," By McFarland, 23rd Design Automation Conference, *IEEE*, 1986, pp. 474–480.

"Partitioning Before Logic Synthesis," By Camposano et al., IBM Thomas J. Watson Research Center, *IEEE*, 1987, pp. 324–326.

"Partitioning and Placement Technique for CMOS Gate Arrays," By Odawara et al., *IEEE Transactions on Computer–Aided Design*, vol. CAD–6, No. 3, May 1987, pp. 355–363.

"Partitioning a Design in Structural Synthesis," By Camposano et al., *IBM Watson Research Center, IEEE*, 1987, pp. 564–566.

"The System Architect's Workbench," By Thomas et al., 1988 *DAC Draft Submission*, Nov. 1987.

"Formal Verification of Digital Circuits Using Hybrid Stimulation," By Srinivas et al., *IEEE Circuits and Devices Magazine*, Jan. 1988, pp. 19–26.

"Tektronix Design Automation Products," 1988, pp. 83–90.

"Formal Verification of the Sobel Image Processing Chip," By Narendran et al., *25TH ACM/IEEE Design Automation Conference*, 1988, pp. 211–217.

"Area–Time Model for Synthesis of Non–Pipelined Designs," By Jain et al., *CH2657–5 1988 IEEE*, pp. 48–51.

"CAD for System Design: Is it Practical?", *IEEE Design & Test of Computers*, Apr. 1989, pp. 46–55.

"Architectural Partitioning for System Level Design," By Lagnese et al., *26TH ACM/IEEE Design Automation Conference*, 1988, p. 62–67.

"Here's an Easy Way to Test Asics," By MacLeod, *Electronics*, May 1989, pp. 116–117.

"Experience with the ADAM Synthesis System," By Jain et al., *26TH ACM/IEEE Design Automation Conference*, 1989, pp. 56–61.

"Chippe: A System for Constraint Driven Behavioral Synthesis," By Brewer et al., *IEEE Transactions on Computer–Aided Design*, vol. 9, No. 7, Jul. 1990, pp. 681–695.

"BAD: Behavioral Area–Delay Predictor," By Kucukcakar et al., *Ceng Technical Report 90–31*, Nov. 1990.

"An Efficient Heuristic Procedure for Partitioning Graphs," By B.W. Kernighan et al., *The Bell System Technical Journal*, Feb. 1970, pp. 291–306.

"Hyper–LP: A System for Power Minimization Using Architectural Transformations," By Chandrakasan et al., *IEEE*, 1992, pp. 300–303.

* cited by examiner

Fig. 16b

| LEVEL / STAGE | SYSTEM LEVEL (1629) | SYSTEM LEVEL (1631) | SYSTEM LEVEL (1633) | BEHAVIOR/ARCHIT. LEVEL (1635) | BEHAVIOR/ARCHIT. LEVEL (1637) | MICRO-ARCHIT. LEVEL (1639) | MICRO-ARCHIT. LEVEL (1641) | LOGIC LEVEL (1643) |
|---|---|---|---|---|---|---|---|---|
| CONCEPT (1645) | SYS. BLOCK DIAGRAM | ARCHITECT. &P FUNCTIONAL | FUNCTIONAL PARTITION. & CHIP PARTITION. | PARTITION LOGIC VS. MEMORY | PRELIM. FUNC. SYS. VECTORS (TEST BENCH) | PRELIM. TRL DESCR. | ENTITY/PORT INTERFACE DEFS (EACH BLOCK) | EXISTING MODULES OR DESIGNS |
| SPECIFICATION (1647) | BLOCK DEFIN. & BEHAV. DESC. | BLOCK FUNCTIONAL SPEC. (BEHAV.) | SYS. TIMING GOALS; AREA & PWR CONSTR. | SYSTEM DATA/CTRL FLOW SPECS | # CHIPS; PKG. SPECS. | MICRO-ARCH. TIMING & AREA GOALS (PWR) | BLOCK RTL SPEC. (SIM) TIMING VS. AREA SPECS | LOGIC DEF COST SPEC; CRIT. PATH SPECS. |
| FEASIBILITY (1649) | ASIC PARTITION | BD./PKG. SIZE&SPEED ESTIMATION | "WHAT-IF" ANALYSIS AND TRADE-OFF ANALYSIS | BOARD FLOOR-PLANNING | COST/SIZE/ SPD./PWR EST. (FLOORPLAN) | ASIC(s) AREA/ SPEED/PWR FEASBLTY. | RTL SYNTHESIS/ OPTIMIZATION (ESTIM. ONLY) | LOGIC/ FUNCTION TECHNOL FEAS. |
| DESIGN (ASIC) (1651) | ASIC(s) BEHAV. DESIGN | ASIC(s) TRL DESIGN | SYSTEM FUNCTIONAL DESIGN | GLOBAL NET-LIST GENERATION | SYSTEM-LEVEL EMULATION/ SIMULATION | ASIC REPART-IONING | CRIT. PATH CONSTR. & DESIGN | CHIP DESIGN (AREA/SPEED) & TEST DESGN. |
| IMPLEMENT (ASIC) (1653) | BEHAV. TECHNOL. BINDING | RTL TECHNOL. BINDING | OPTIMIZ-ATION | SYNTHESIS &P OPTIMIZ. | FINAL SCHEM. FLOORPLAN, PLACEMENT, TIMING EST. | CHIP TIMING IMPLEMENT | CRIT. PATH OPTIM. & LAYOUT | CHIP(s) LAYOUT |
| VERIFY (1655) | SYSTEM FUNCTION | SYSTEM CONSTR. | SYSTEM TIMING | CHIP(s) FUNCTION | CHIP(s) TIMING CONSTR. | CRITICAL PATHS | CHIP LEVEL LOGIC VS. LAYOUT | TEST GEN. TEST COVERAGE |

1625

METHOD AND SYSTEM FOR CREATING AND VALIDATING LOW LEVEL DESCRIPTION OF ELECTRONIC DESIGN

CROSS-REFERENCE TO RELATED APPLICATIONS

This application is a continuation of U.S. patent application Ser. No. 08/077,403 dated Jun. 14, 1993 U.S. Pat. No. 5,553,002 which is a CIP of U.S. patent application Ser. No. 08/077,294 dated Jun. 14, 1993 U.S. Pat. No. 5,544,067 which is a CIP of U.S. patent application Ser. No. 08/054,053 dated Apr. 26, 1993 now abandoned which is a continuation of U.S. patent application Ser. No. 07/507,201 dated Apr. 6, 1990 U.S. Pat. No. 5,222,030 which is a CIP of U.S. patent application Ser. No. 07/917,801 dated Jul. 20, 1992, now U.S. Pat. No. 5,220,512 which is a continuation of U.S. patent application Ser. No. 07/512,129 dated Apr. 19, 1990, now abandoned.

TECHNICAL FIELD OF THE INVENTION

The present invention relates to computer-aided design tools and techniques for the design and implementation of complex circuits and systems, particularly digital devices.

BACKGROUND OF THE INVENTION

Present day state-of-the-art design technique, logic synthesis, is really only a mapping between different levels of physical abstraction.

One of the most difficult problems in design automation is the inability to get timing closure at even the gate level effectively. This forces designers to do two designs: logic design and timing design. Otherwise, the designer simply over-designs the circuits, because the best case timing is much different from the worst case timing. In other cases, designers insist on control of device layout so that they can evaluate all of the tradeoffs between implementation and timing.

Present computer aided design (CAD) systems for the design of electronic circuits, referred to as ECAD or Electronic CAD systems, assist in the design of electronic circuits by providing a user with a set of software tools running on a digital computer with a graphical display device. Typically, five major software program functions run on the ECAD system: a schematic editor, a logic compiler, a logic simulator, a logic verifier, and a layout program. The schematic editor program allows the user of the system to enter and/or modify a schematic diagram using the display screen, generating a net list (summary of connections between components) in the process. The logic compiler takes the net list as an input, and using a component database puts all of the information necessary for layout, verification and simulation into a schematic object file or files whose format(s) is(are) optimized specifically for those functions. The logic verifier checks the schematic for design errors, such as multiple outputs connected together, overloaded signal paths, etc., and generates error indications if any such design problems exist. The logic simulator takes the schematic object file(s) and simulation models, and generates a set of simulation results, acting on instructions initial conditions and input signal values provided to it either in the form of a file or user input. The layout program generates data from which a semiconductor chip (or a circuit board) may be laid out and produced.

The Modular Design Environment (MDE) produced by LSI Logic Corporation of Milpitas, California, is a suite of software tools for computers running the UNIX operating system. MDE comprises a schematic editor (LSED) and a simulator (LDS), among other software programs, and provides an example of commercially available tools of the aforementioned type. Another example of a schematic editor, schematic compiler, and schematic simulator may be found in the SCALDstation produced by Valid Logic Systems, Inc. of Mountain View, California.

VHDL, or VHSIC (Very High Speed Integrated Circuit) Hardware Description Language, is a recently developed, higher level language for describing complex devices. The form of a VHDL description is described by means of a context-free syntax together with context-dependent syntactic and semantic requirements expressed by narrative rules. VHDL is described in *IEEE Standard VHDL Language Reference Manual* (IEEE Std 1076-1987), and is also known as MIL-STD-454, Regulation 64.

VHDL represents an important step forward in design specification languages because the semantics, or intent, of the language constructs are clearly specified. In theory, VHDL unambiguously describes a designer's intended system or circuit behavior, in syntactic terms. The "design entity" is the primary hardware abstraction in VHDL. It represents a portion of a hardware design that has well-defined inputs and outputs and performs a well-defined function. A design entity may represent an entire system, a sub-system, a board, a chip, a macro-cell, a logic gate, or any level of abstraction in between. A "configuration" can be used to describe how design entities are put together to form a complete design.

VHDL supports three distinct styles for the description of hardware architectures. The first of these is "structural" description, wherein the architecture is expressed as a hierarchical arrangement of interconnected components. The second style is "data-flow" description, in which the architecture is broken down into a set of concurrent register assignments, each of which may be under the control of gating signals. This description subsumes the style of description embodied in register transfer level (RTL) descriptions. The third style is "behavioral" description, wherein the design is described in sequential program statements similar to a high-level programming language. In the main hereinafter, the behavioral description style is discussed. However, all three styles may be intermixed in a single architecture.

A methodology for deriving a lower-level, physically-implementable description, such as a RTL description of the higher level (e.g. VHDL) description, via an intermediate rule-based tool such as Prolog, is disclosed herein.

Prolog is a programming language based on predicate logic. It can be used for "intelligent" tasks like mathematical theorem proving. A Prolog program is a set of rules which define the relationships among objects. The general form of a Prolog rule is a "horn" clause, in which a specified "goal" is true if certain conditions are true. Execution of a Prolog program involves finding a proof for the goal in question, using unification and resolution. An important aspect of Prolog employed in the present invention is "term__expansion", which converts predefined rules into ordinary Prolog clauses.

Generally, there is a need to make improvements in the tools and techniques used to implement electronic designs (i.e., the designs of circuits and systems), in other words to assist the designer in the task of creating an efficient physical implementation (e.g., in silicon) of a concept (e.g., design specification). Some specific ones of these needs are discussed in greater detail hereinbelow.

DISCLOSURE OF THE INVENTION

It is therefore an object of the present invention to provide a methodology for deriving a valid structural description of a circuit or system from a behavioral description thereof, thereby allowing a designer to work at higher levels of abstraction and with larger, more complex circuits and systems.

It is a further object of the present invention to provide a technique for automatically translating behavioral descriptions of a circuit or system into physical implementations thereof.

It is further object of the invention to raise the level of design validation from a structural (net list) level to a behavioral level.

It is a further object of the invention to provide a more standardized design environment, thereby alleviating the need for cross-training between different design platforms and allowing resources to be directed more towards synthesis and testability.

It is an additional object of the invention to provide an improved technique for design of complex systems from high-level semantic specifications and descriptions.

It is an additional object of the invention to provide an improved technique for partitioning electronic designs.

It is an additional object of the invention to provide a technique for accurately estimating, at high levels of abstraction, such as at the level of semantic specifications and descriptions, various constraints of a physical implementation of an electronic design, such as area and power requirements, timing parameters, and other relevant constraints of the design, particularly for use in the partitioning technique described hereinbelow.

SUMMARY OF THE INVENTION

According to the invention, there is provided an electronic CAD system operated with a suite of software tools for enabling a designer to create and validate a structural description and physical implementation of a circuit or system (hereinafter, "device") from a behavior-oriented description using a high-level computer language. One skilled in the art to which the invention most nearly pertains will understand that the tools and techniques described herein are readily adapted to work on any suitable CAD system.

The methodology of the invention includes the following steps:

First, the designer specifies the desired behavior of the device in a high-level language, such as VHDL. The description includes high-level timing goals.

Next, in a "behavioral simulation" step, starting with the VHDL behavioral description of a design, the designer iterates through simulation and design changes until the desired behavior is obtained.

Next, in a "partitioning" step, the design is partitioned into a number of architectural blocks. This step is effectively one of exploring the "design space" of architectural choices which can implement the design behavior. Links to the physical design system enable high level timing closure by constraining the feasible architectural choices to those which meet the high-level timing and area (size) goals. This is a key step because it represents the bridge between the conceptual level and the physical level. A second function of this step is to direct the various architectural blocks to the appropriate synthesis programs.

According to an aspect of the invention, described in greater detail hereinbelow, in an embodiment of the invention, the partitioning technique is driven by constraints of the physical implementation of the electronic design (e.g., system, circuit, or the like).

Next, in a "logic synthesis" step, a number of separate programs are used to efficiently synthesize the different architectural blocks identified in the partitioning step. Those blocks having highly regular structures or well understood functions are directed to specific synthesis tools (e.g. memory or function compilers). Those blocks with random or unstructured logic are directed to more general logic synthesis programs. The output of this step is a net list of the design.

Next, in a "physical simulation" step, the gate-level design description is simulated, comparing the results with those from the initial behavioral. simulation. This provides a check that the circuit implementation behaves as intended, and that the timing goals are achieved.

Optionally, the design is back-annotated to ensure that other physical design limitations, such as capacitive loads and parasitics, are not exceeded.

Finally the design is input to existing software systems which control the physical implementation of the design, such as in an ASIC (Application Specific Integrated Circuit) device.

An important feature of the present invention is that, as with all top-down design approaches, the foregoing is a process of architectural refinement in which design realization moves down through levels of abstraction. The characteristics of VHDL and the disclosed methodology enable this process to occur without losing the intent and meaning present at higher levels. This is the key to automating the process.

Another important feature is that the partitioning step, or partitioner, in effect, uses high-level timing information extracted from the chip floorplan to constrain the design into the feasible architectural choices which meet the high-level timing goals. These constraints are key to allowing the process to converge to specific physical embodiments.

Another important feature is that the methodology enables timing closure without going to actual layout, solving one of the most difficult problems in design automation today, namely the inability to get timing closure at even the gate level effectively which in the past has forced designers to create two designs: a logic design and a timing design. Using the methodology disclosed herein, timing closure can be obtained by using a form of back annotation which will extract timing data from floorplanning-level layouts and then incorporate this data into the I/O (Input/Output) ports of the VHDL behavioral description.

According to an aspect of the invention, the behavioral (VHDL) description of the device is interpreted by attaching one or more semantic rules to each of the syntactic rules underlying the behavioral description. This is accomplished (such as via Prolog) using a "syntax attributed tree".

Further according to the invention, a top-down design methodology is disclosed, wherein a matrix of milestones (goals in the design activity) is defined by degree of complexity (level of abstraction) of a design and for progressive stages (levels) of design activity (from concept through implementation). The milestones are defined in a monotonic, unidirectional manner using continuous refinement, and the design activity proceeds towards subsequent milestones. As milestones are achieved, previous design activity becomes fixed and unalterable. Single level or multi-level estimators (predictors) determine the direction of the process. The methodology is scalable for increasing design complexity.

Further according to the invention, techniques are disclosed for constraint-driven partitioning of behavioral descriptions, and effective partitioning of high level descriptions for synthesis of multiple chips or blocks at the logic or register transfer levels. The partitioning technique is level-independent, and is integrated with the top-down design process, and takes into account constraints such as area, timing, power, package cost and testability. Iterative refinement is used to arrive at partitions that meet constraints imposed at high levels of abstraction.

Further according to the invention, techniques are disclosed for estimating constraints, particularly (i.e., as an example of constraints, generally) the power and area requirements, of the physical implementation of the device, at early, high level stages of the design process (e.g., at the system, behavioral, and register transfer level stages). The techniques are suited to the design of any semiconductor device, particularly CMOS devices.

Further according to the invention, techniques are disclosed for estimating constraints, particularly (i.e., as an example of constraints, generally) design performance, more particularly timing characteristics, from behavioral/functional descriptions. Given a behavioral or a block diagram description of data flow in a design, pin-to-pin timing and minimum clock cycle for the design can be estimated accurately. An RTL description may thus be synthesized from a behavioral description such that timing constraints imposed at the behavioral level are achieved. The timing of a synthesized design is estimated, and the design is resynthesized until a design is arrived at that meets timing constraints imposed at a higher level.

Other objects, features and advantages of the invention will become apparent in light of the following description thereof.

BRIEF DESCRIPTION OF THE DRAWINGS

FIG. 16b is a chart of a specific milestone matrix directed to the design of an integrated circuit, according to the present invention.

DETAILED DESCRIPTION OF THE INVENTION

Introductory Comments

Figure 1:
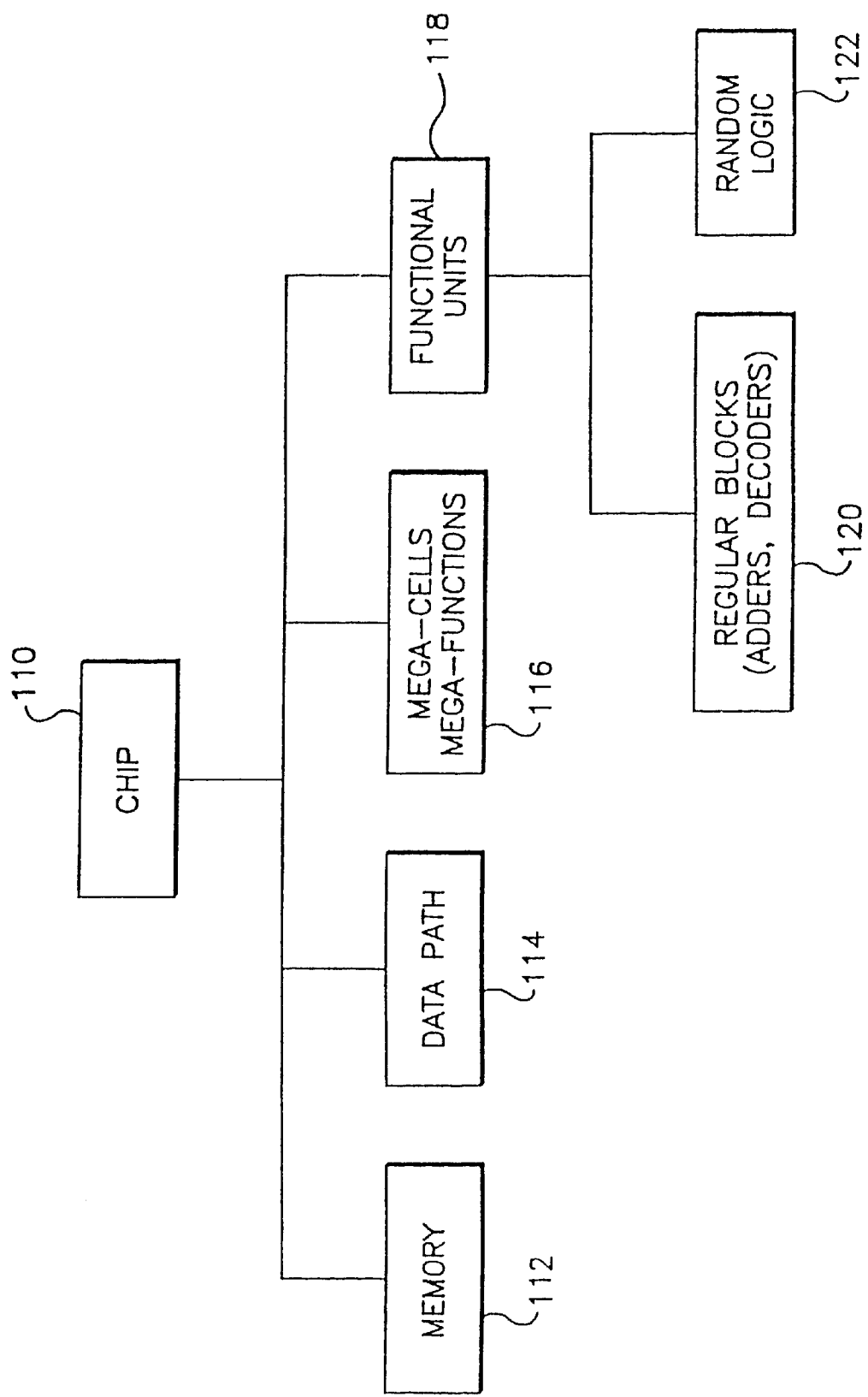
FIGS. 1–7 are schematic representations of the methodology of the present invention.

In modern digital systems, designs incorporating 70,000 logic gates or more are not uncommon. Also, in modern analog electronic systems, especially where the function being designed is intended to be incorporated into an integrated circuit, it is not uncommon to encounter designs comprising many hundreds of transistors and other electronic devices. These designs, due to their complexity, present a need for frequent simulation of the circuit being designed in small parts before it is simulated as a whole. This is necessary because errors in a small portion of the circuit are easy to detect when that small portion is simulated in isolation. On the other hand, when the entire circuit is simulated, compound errors may occur which mask other errors. Further the enormity of modern circuit complexity makes the errors in the small portion of the circuit difficult to recognize.

In the prior art, the process of designing an electronic circuit on a typical ECAD (Electronic CAD) system is done in several discrete steps. A schematic diagram of the circuit is entered interactively through the use of a schematic editor which produces a digital representation of the circuit elements and their interconnections. The user of the ECAD system then prepares a list of input stimuli (vectors) representing real input values to be applied to the simulation model of the circuit. This representation is then compiled by a schematic compiler and translated into a form which is best suited to simulation. This new, translated representation of the circuit is then operated upon by a simulator, which produces numerical outputs analogous to the response of a real circuit with the same inputs applied. This output is then usually presented to the user in a graphical fashion. By viewing the simulation results, the user may then determine if the represented circuit will perform correctly when it is constructed. If not, he may then re-edit the schematic of the circuit using the schematic editor, re-compile and re-simulate. This process is performed iteratively until the user is satisfied that the design of the circuit is correct.

The schematic editor of the ECAD system is usually an interactive software tool which enables the user to select from a number of circuit elements which will be graphically displayed upon a graphical/text display device, hereinafter referred to as the display screen, connected to the computer. These displayed elements may then be interconnected by lines representing wires drawn on the display screen by the user through interaction with the computer via a position input device, which may be a pointing device such as a mouse, trackball, joystick, graphic tablet, or keyboard used to enter coordinates on the display screen and commands to the software tool. The circuit elements and their interconnecting wires form a schematic diagram which is viewed either in whole or in part on the display screen. As the schematic diagram is constructed on the display screen, the computer represents these elements in a storage medium, which may be a memory or a mass storage device such a magnetic disk drive. These representations, taken as a group, form a numerical representation of the schematic which has been entered by the user in a standardized form which is understood by the schematic editor. Typically, this form has been optimized for the entry and modification of schematic information.

Often, schematic editors allow for heirarchical design whereby a previously created and stored schematic may be recalled and viewed and used as a macro-level component in other circuits. Multiple instances of such macro-level components may be included in a higher-level schematic diagram. The schematic editor creates data structures effectively replicating the macro-level component. The higher-level schematic may further be incorporated as a macro-level component into yet higher-level schematic diagrams, and so on.

FIG. 12

Figure 12:
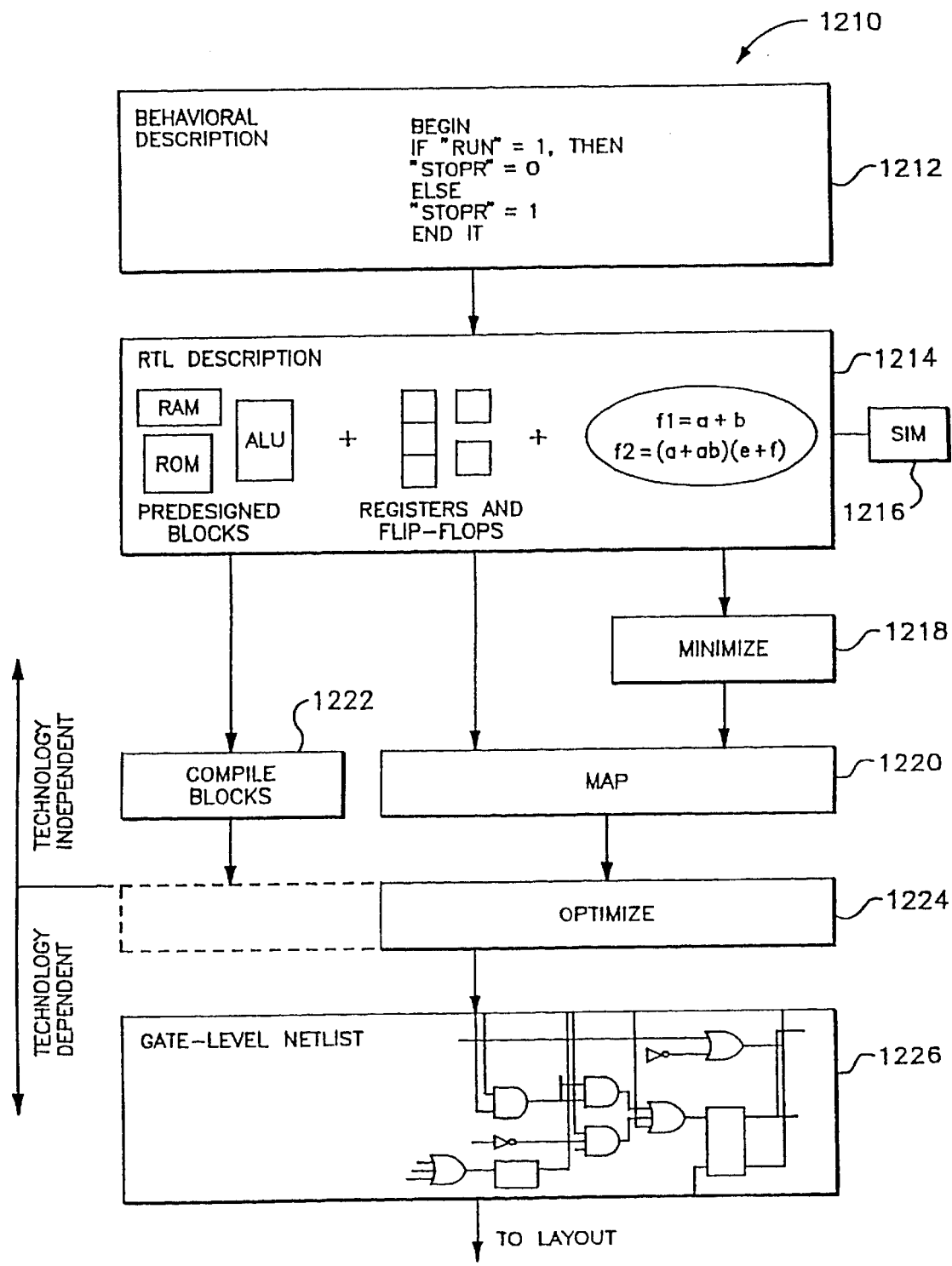
FIG. 12 is a block diagram of a generalized logic synthesis methodology, lacking critical features of the present invention.

FIG. 12 shows a generalized design methodology 1210. It should be understood that the descriptions contained herein are in terms of a suite of software "blocks" that can be run on any suitable computer system (not shown).

A designer begins designing a circuit (or system) by formulating a behavioral description of a circuit's desired behavior in a high-level computer language, such as VHDL. This is represented in the block 1212, which shows exemplary high-level code describing a desired behavior.

Next, the designer re-formulates the design as a register-transfer level (RTL) description of the circuit in terms of pre-designed functional blocks, such as memories and registers. This is represented in the block 1214.

The resulting RTL description is simulated, in a block 1216, to ensure that it equates to the original behavioral description. At that point, the design consists of synthesizable parts (combinational logic, registers and flip-flops) and non-synthesizable parts (pre-designed blocks).

The logic is then minimized in a block 1218, by finding common terms that can be used repeatedly, and maps the description into a specific technology (e.g., CMOS) in a block 1220. Further, the non-synthesizable parts are compiled in a block 1222.

The foregoing steps 1212 through 1222 are all technology independent (except for the step 1222, to the extent that it is technology dependent).

The design of at least the synthesizable parts is optimized in a block 1224 to produce a gate-level net list 1226.

The blocks 1218 through 1222 represent a typical logic synthesis tool.

Strictly speaking, only the steps after the RTL description is produced constitute "logic synthesis", and such a bottom-up approach (re-formulating the behavioral description into a RTL description) tends to be flattened out and/or lose much of the intent of the original behavioral description, as well as being labor-intensive and error-prone.

According to the present invention, described below, "behavioral synthesis" will bridge the gap between a behavioral description and a RTL description to produce a valid gate-level net list automatically from a high-level behavioral description. In a sense, behavioral (e.g., VHDL) and RTL circuit descriptions can both be considered "high-level" descriptions, since they do not deal with gate-level representations. The distinction between a behavioral description and a RTL description is primarily in the amount of structure that they specify and in the "allocation" or definition of structural components that will be used in the resulting gate-level implementations. Behavioral descriptions do not address the issue of what specific structural components (e.g. memory, functional blocks, etc.) are to be used. In an RTL description, structural components are explicitly identified and there is a direct mapping between this description and the resulting gate-level implementation.

The ability to synthesize behavioral and RTL descriptions is significantly impacted by this difference in structural content. RTL synthesis ("low-level" synthesis) is a relatively well-studied, and much implemented, technology. The ability to synthesize an RTL description into a gate-level implementation is well established. The present invention discloses a methodology for mapping a behavioral description with little or no structural content into a RTL level description with significant structural content. This is largely, but not entirely, a top-down design methodology.

What is lacking in a strictly top-down design methodology is the use of detailed knowledge of lower level physical information of the modules (circuits, functional blocks, etc.) being designed. Typically, the decisions concerning the selection and placement of modules are deferred until the time the behavioral synthesis is complete and an RTL structure has been chosen for the implementation. The reason for this is that, typically, structural information is not available at the behavioral level, and hence the system is unable to employ criteria such as area and delays while exploring the design space. Details such as layout, module size and interconnect can have an enormous effect on the shape of the RTL design space.

As will become evident hereinafter, partitioning the design at a high level (behavioral description) into architectural blocks creates a "vehicle" for providing such structural information at the behavioral description level, thereby adding the ability to estimate lower-level physical parameters. Further, partitioning helps the designer explore other avenues such as operator level parallelism and process level concurrency in order to improve the design.

FIGS. 1–8

There follows an exemplary embodiment of the invention described in the context of an ASIC design.

FIG. 1

FIG. 1 is a simplistic view of an ASIC chip 110, covering gate arrays and standard cells, in the context of synthesis. In general, an ASIC chip consists or all or some of the different functional entities shown in the Figure. Moreover, the Figure describes means for synthesis/compilation and optimization of these blocks. Not shown in the Figure are the chip's I/O buffers and periphery. Although synthesis tools are not meant to manipulate I/O buffers, nevertheless their timing description in the optimization environment can be beneficial for optimization of the chip's core part.

The exemplary chip 110 includes the following major functional blocks: memory 112, data path 114, mega-cells and mega-functions 116 and functional units 118 which may include regular blocks 120 such as adders and decoders and random logic 122.

The memory block 112 is generated by memory compilers using efficient technology-dependent building blocks. The output of the memory compiler is a net list of primitive transistors.

The data path block 114 is generated by providing the behavioral description in an HDL (Hardware Definition Language) language. The data paths can be synthesized through general purpose synthesis programs or specialized data path compilers. The output of the synthesis programs/compilers is the structural description of the design using ASIC macro-cells.

The mega-cell and mega-function block 116 is chosen from pre-designed building block libraries, which are already designed for optimal performance.

The regular functional units 120 are generated using regular blocks such as adders, decoders and multiplexers. These blocks can be further optimized, if desired.

The random logic blocks 122 includes random logic, glue logic and the state controller. The description of these units is provided in Boolean equations, truth table, data flow and HDL description. This part of the chip is designed around the other parts. This functional unit is partitioned into smaller chunks of functional units, and the process is recursively repeated. The atomic features are still functional units that are readily functionally verifiable. A general purpose synthesis/optimization tool is used to create these functional units, and to optimize the units according to the specified constraints and those imposed by memory, regular blocks and data path sections.

FIGS. 2–5

FIGS. 2–5 describe a synthesis design methodology that is independent of any particular design style or technology. The various steps (blocks) of this methodology are represented by the circled numerals 1–18, and are as follows:

Step 1 is Design Specification. This consists of system (device) specification and may include functional specifications of subsystem elements, timing specifications and I/O requirements, and power, package and interface requirements.

Step 2 is Design Description. This is the functional description of the design and all its subsystem elements. The description is, ideally, given in a high level description language, such as VHDL. Depending on the nature of the design, the description can be entirely at the behavioral level, or it may be intertwined with an RTL description.

Figure 13:
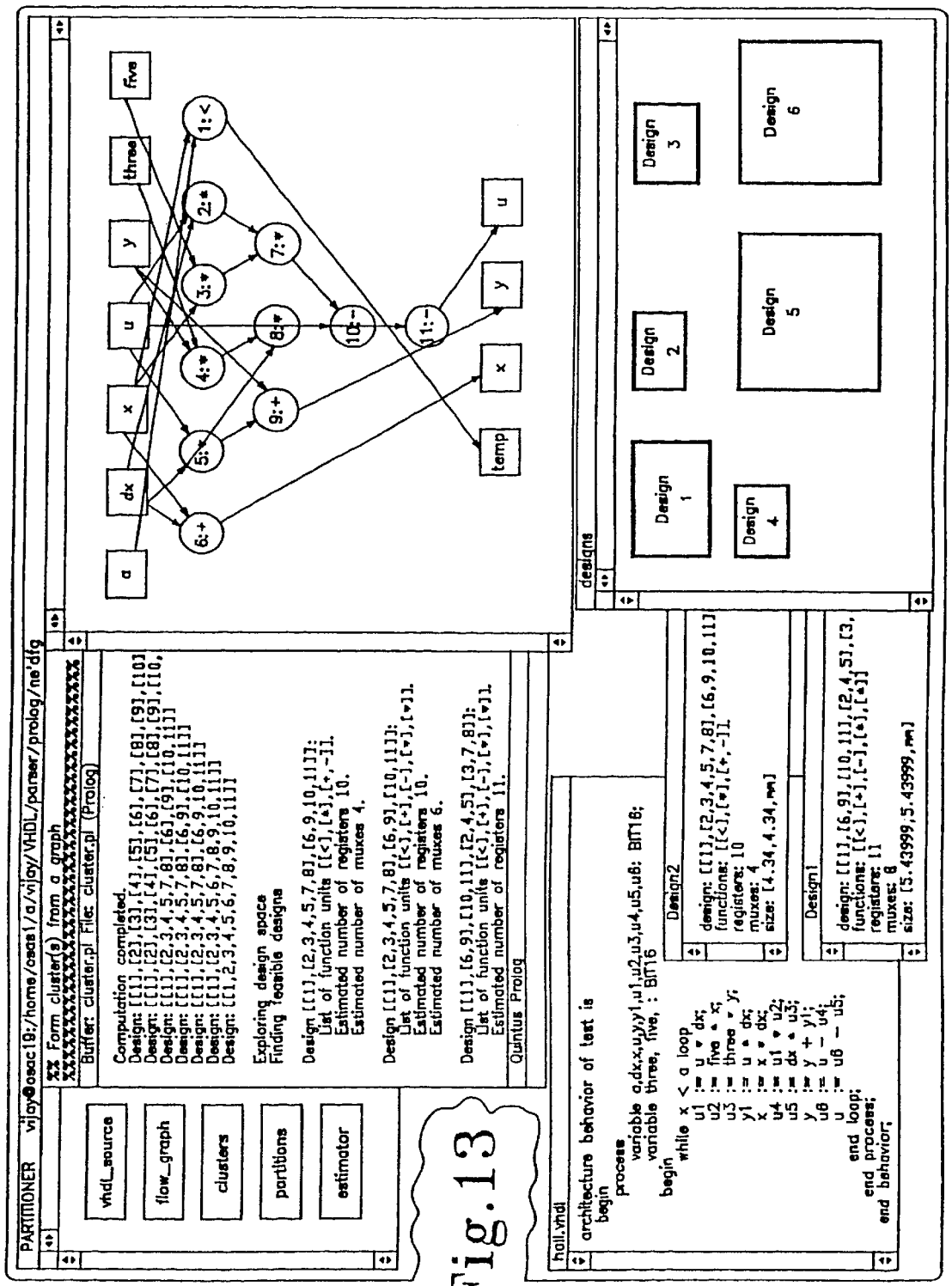
FIGS. 13–15 are exemplary screen displays generated by a computer system employing the methodology of the present invention.
Figure 14:
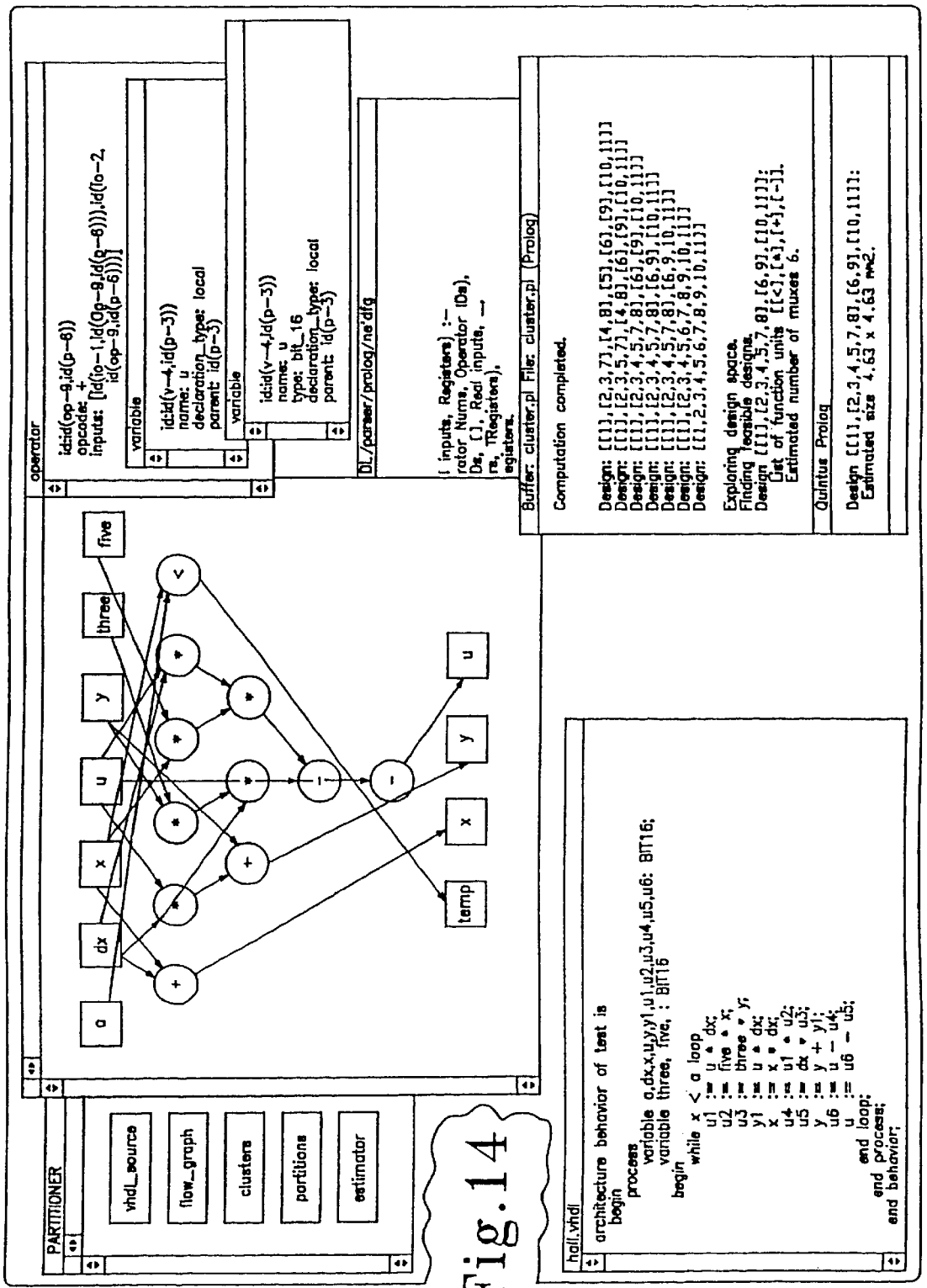
Figure 15:
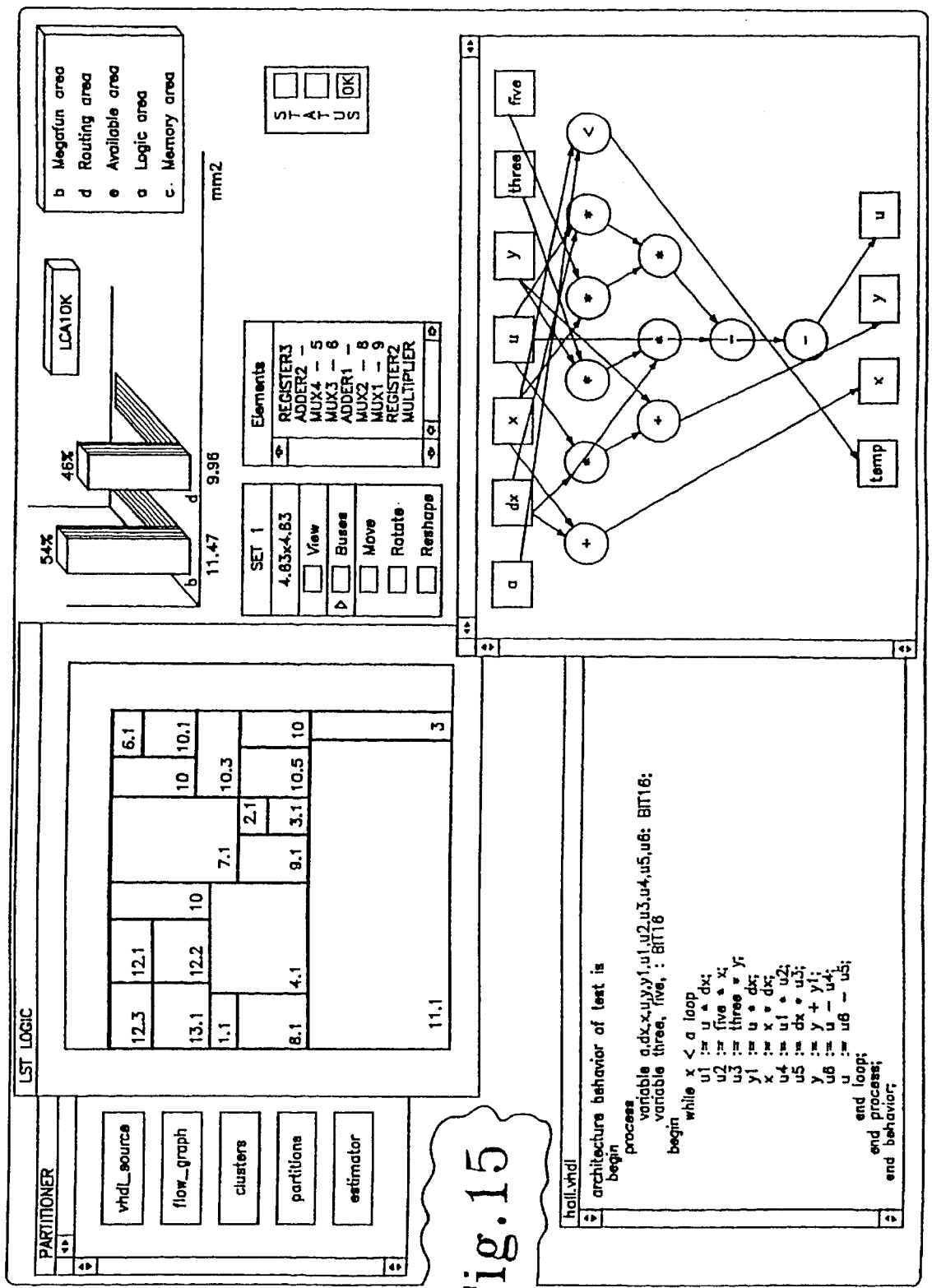

Step 3 is Partitioning. Given the behavioral description of the design, partitioning (the Partitioner) breaks the design into separate modules that will make the overall synthesis, analysis and verification tasks more manageable. In doing so, the Partitioner consults technology files (described hereinafter) containing packaging, I/O capabilities and other technology-dependent information to optimally partition the design. In addition to functionally partitioning the design, the Partitioner can help the designer (see FIGS. 13–15 showing representative screen displays of the CAE system) in choosing the optimal architecture that would optimize the design, e.g. in terms of area and speed.

Step 4 is Module Description. Three modules are shown, but there could be many more modules involved. This is the RTL description of the partitioned design, in terms of an HDL (hardware definition language) description. Each module is accompanied with a set of timing and area constraints, which are related only to that module's domain (they are not automatically derived from the design description).

Step 5 is Composition. Composition is the opposite of partitioning, and facilitates examination and verification of the partitioned design. The partitioned design is reconstructed in this step, the end product of which is an RTL description of the entire design.

Step 6 is Functional Verification (Behavioral). Verification at the behavioral level is performed at two stages— while the design is being developed, and after the partitioning step. The former is source code debugging where the high level description of the design is verified for correctness of the intended functionality. The latter is to verify the architectural decisions that were made during partitioning, and to examine their impact on the functionality and performance of the entire design.

Figure 2:
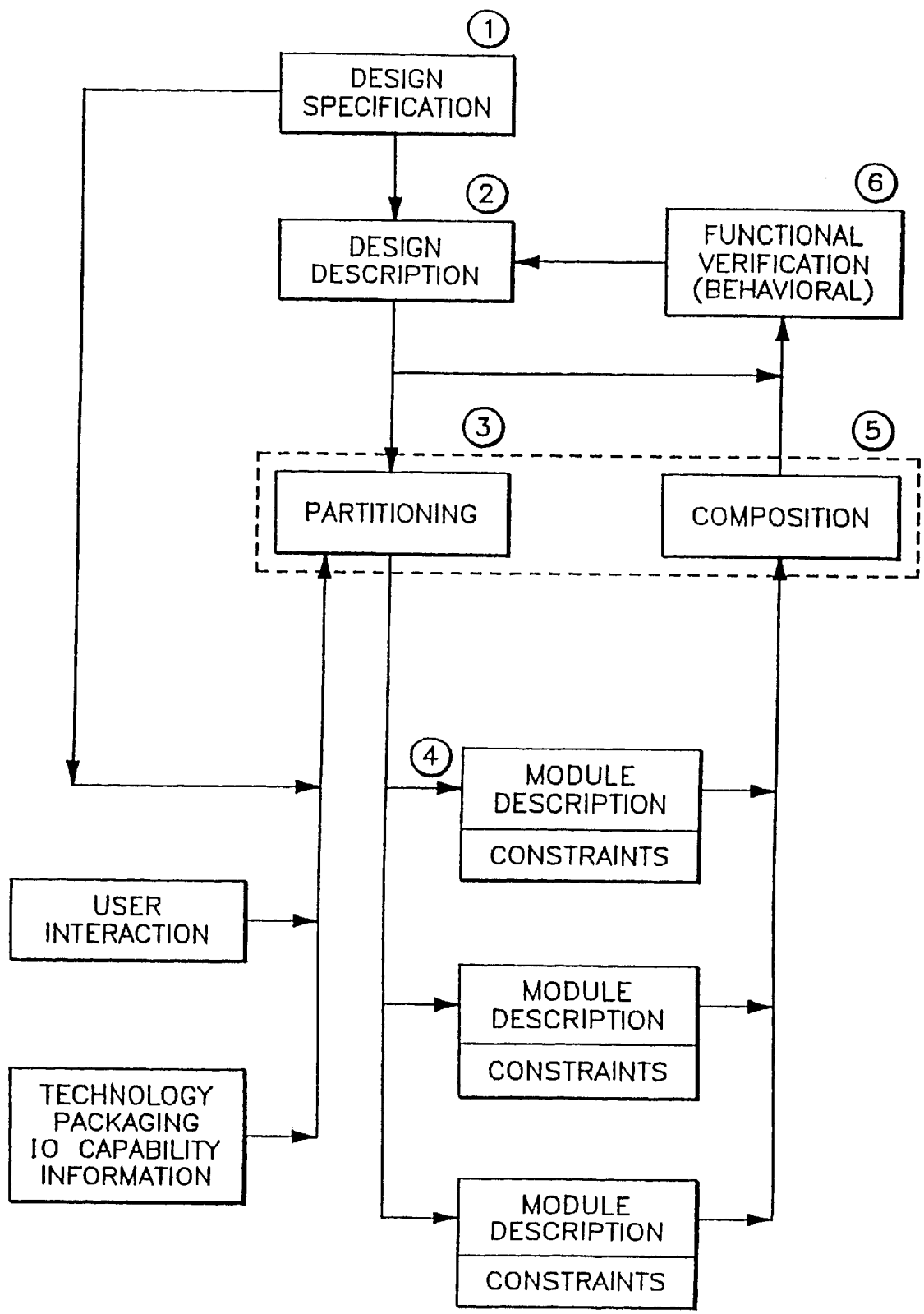
Figure 4:
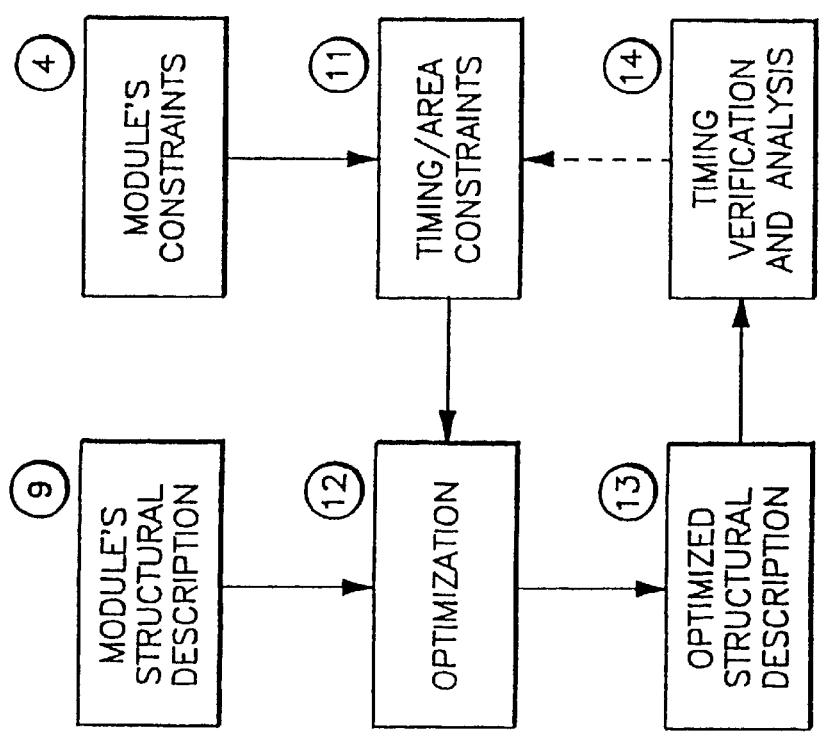
Figure 3:
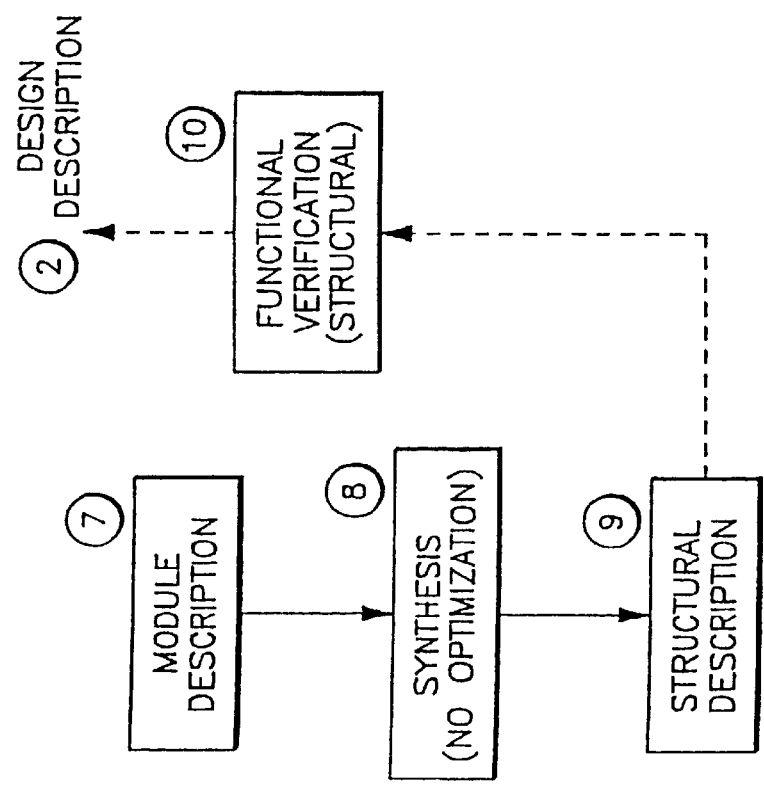
Figure 5:
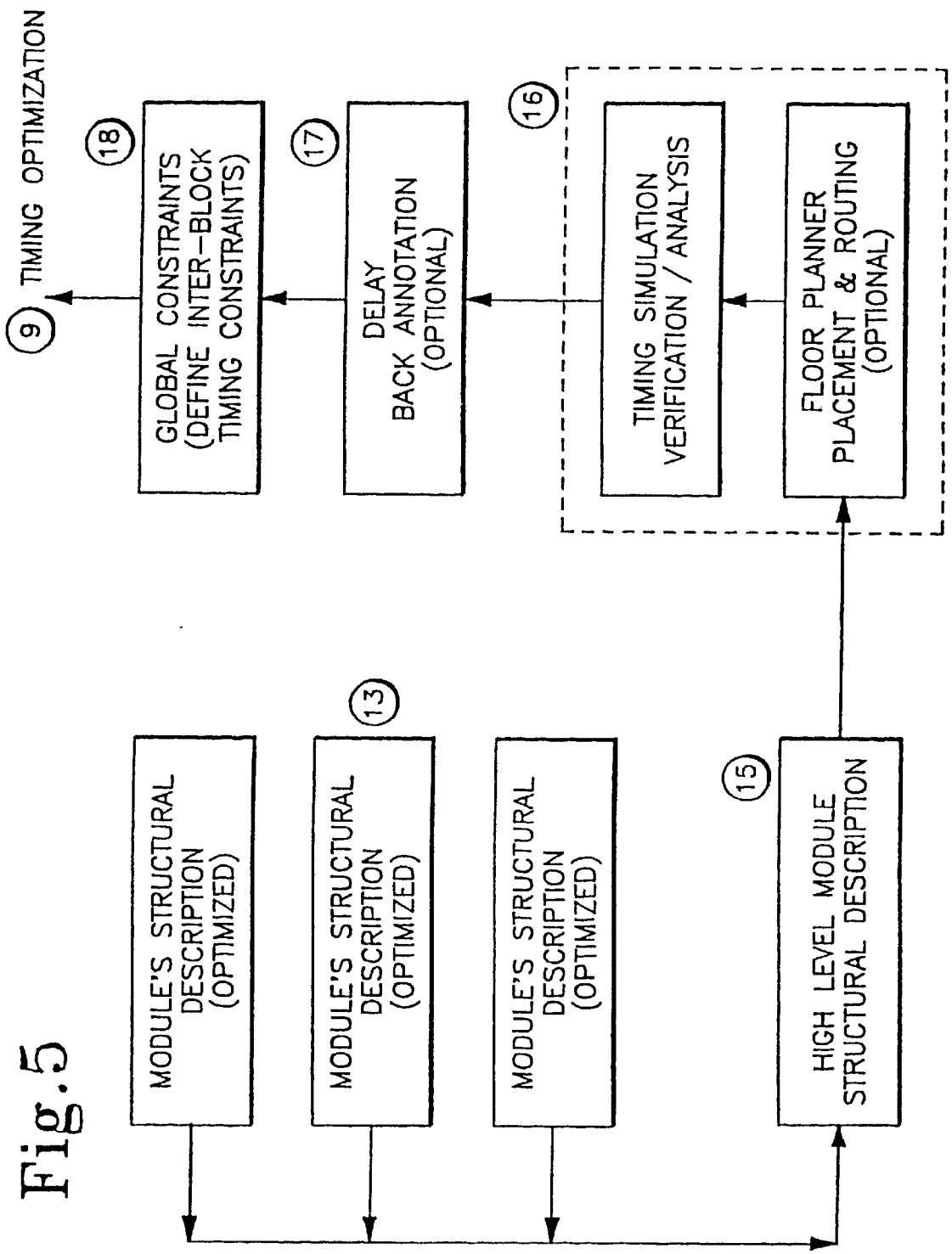

It will be noticed, in the above description of the steps shown in FIG. 2, that various "loops" are formed. A high level loop consists of behavioral verification (step 6) to debug the design description (step 2). A lower level loop consists of behavioral verification (step 6) of the partitioned (step 3) and composed (step 5) design. The partitioning process is guided by user interaction, and is driven by physical implementation factors such as technology, packaging, I/O capability and other information about the proposed device which is developed based on experience with similar devices.

Step 7 is Module Description. This is the description of a functional entity that is produced by the Partitioner or developed independently by the designer. This is preferably given in one of the following formats: HDL, truth table, equations or net list. As used in this example, a "module" is a functional block with a complexity of less than 3000 cells (it is not a chip with I/O pads).

Step 8 is Synthesis. Given the module description (step 7) and a target technology library, the design is mapped into the target technology. The synthesis process usually includes some form of logic optimization. This is the task of manipulating the logic expressions that define the functionality of the module (device). Minimization is done by removing redundancies, and adding or removing intermediate levels of logic (e.g., re-structuring of Boolean expressions).

Step 9 is Structural Description. This is the gate-level, technology-dependent description of the module produced by the synthesis tool. It is usually given in the form of a net list, from which a device can be automatically physically created.

Step 10 is Functional Verification (Structural). This is done to verify the correctness of the module against the intended functionality. This is only required if functional verification at the behavioral level (step 6) has not been performed. One assumes that the circuit generated by the synthesis tool complies (functionally) with the given module description. In case of discrepancies, the module description needs to be modified (debugged) at the top level, i.e. Design Description (step 2). This is necessary in order to preserve the integrity of the design and all of its subsystem elements.

Step 11 deals with Timing/Area Constraints. These are used to customize the optimization process. Optimization is usually driven by area and speed (timing) constraints. These might instruct the tool to perform rudimentary area versus speed trade off on individual or small clusters of gates, or to perform comprehensive area and speed optimizations in combination with other constraints such as drive capability. A rich set of constraint constructs is required for meaningful design optimization, and are provided in the methodology of this invention. Timing constraints may include the following: maximum and minimum rise/fall delay, set-up and hold check, length of clock cycle and maximum transition time per net. The timing constraints may also include boundary conditions, such as signal skew at the module's inputs, drive capabilities of the modules outputs, etc., when such data is available.

Step 12 is Optimization. Given the design constraints and the module's structural description, the optimization process tries to modify the module so that its area and timing characteristics comply with the specified constraints. Depending on the nature of the design and the strength of the constraints, some or all optimization goals will be achieved. When no boundary conditions are available, optimization may be general purpose, aimed at minimization of the overall module. With boundary conditions, the objective is to optimize each module so that the overall higher level module complies with the specified timing requirements.

Step (block) 13 represents generating the Structural Description of the module after the optimization process.

Step 14 is Timing Verification and Analysis. This is a process of examining the effects of the optimization process (step 12), and examining its global impact. Tools such as static timing analyzers and gate level simulators would be employed. If the optimized module (step 13) does not meet all of the timing and area requirements, further trade-offs have to be made at this point. The constraints are then modified to reflect these trade-offs, and the optimization process (step 12) is repeated.

Step 15 represents a high level module, derived from the module's optimized Structural Description (step 13). A high level module consists of one or more sub-modules. Each sub-module has been optimized in its own domain. The high level module describes the interaction and connectivity between the sub-modules. When hierarchically applied, the target device itself is considered to be a high level module.

Step 16 is Timing Simulation, Verification and Analysis. At this stage, the optimized modules are composed (see step 5) together and implement the intended functionality of the high level module, or target device. Here, analysis includes logic level simulation, static timing analysis, electrical rule checking, etc. For more accurate analysis, it might be necessary to use a floor-planner or placement and routing programs to estimate wire delays. The wire delays are then back annotated into the design database prior to simulation. If the overall timing characteristics of the modules do not meet the specified requirement,a the timing constraints of the sub-modules are modified and optimization is performed.

Step 17 is Delay Back Annotation (DBA), which is optional. The inter-block wire delays can be more accurately estimated only after floor-planning of the sub-modules. More accurate intra-block and inter-block delays are determined after the placement and routing stage. Using these tools, the wire delays can be estimated more accurately. The delays can be back annotated to be used by the gate level Optimizer (step 12).

Step 18 represents introducing Global Constraints. Using the results of the analysis performed, the sub-modules' timing/area constraints are modified to reflect the global timing requirements. Sub-modules with new constraints are then re-optimized.

FIG. 6

Figure 6:
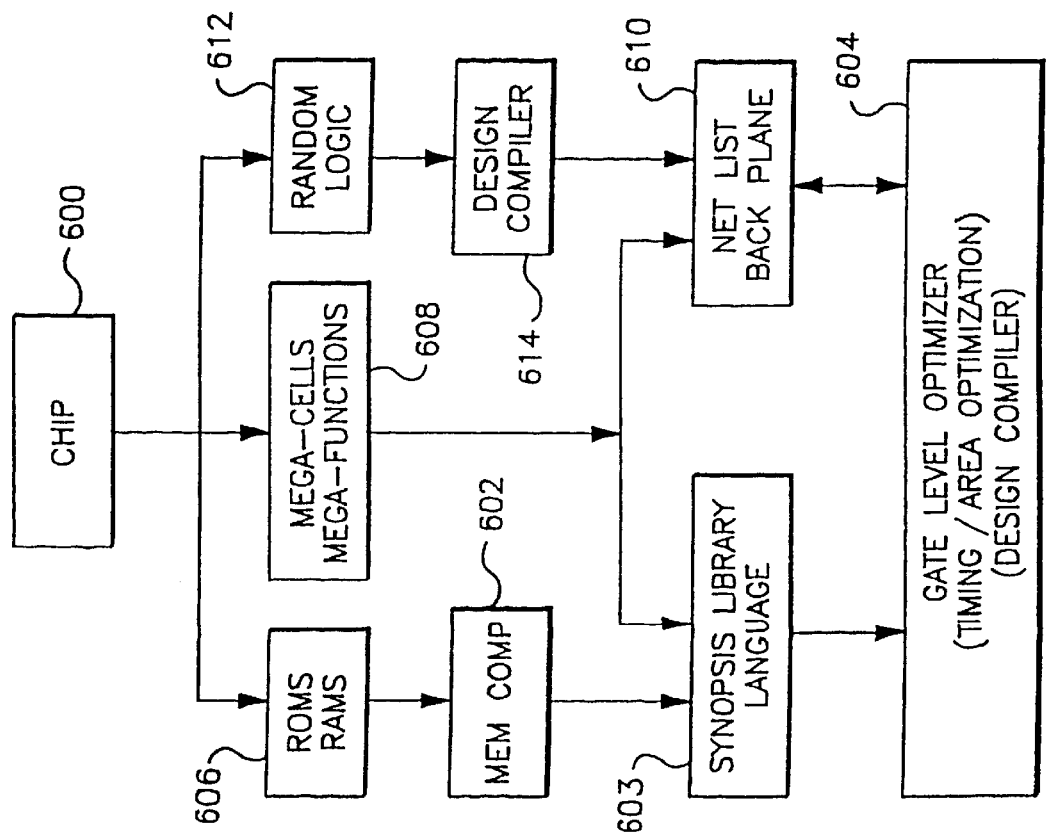

FIG. 6 illustrates the usage of exemplary synthesis and optimization tools, and the abstraction level for the exchange of design data between these tools and a Design Compiler. Each tool addresses the synthesis or compilation of one or more of the major functional blocks of an exemplary ASIC chip 600. The usage of these tools and their interaction with the Design Compiler are of particular interest.

A Memory Compiler (MemComp) 602 takes the high level specification for memory mega-cells and produces logic and layout files for the purpose of simulation, testing and layout. The objective is to provide the Design Compiler (Optimizer) 604 with an accurate timing description of and drive capability information for the memory block. MemComp synthesizes high density or low power RAM or ROM blocks 606. As will become evident, the surrounding logic is optimized with respect to the memory block. The memory block created by MemComp 602 is provided in the same format as the internal macro-cells, i.e. a net list of primitive transistors, which cannot be read directly by the Design Compiler 604. Therefore, one of two possible intermediate steps is required: 1) (not shown) the data sheet generated by MemComp is used to manually extract the timing description of the memory block. This basically involves defining a set of "set_load", "set_drive" and "set_arrival" constraints and associating them with the relevant pins of the surrounding logic at the start of the optimization process; or 2) a Memory Modeller (see FIG. 8) is used to generate a model 603 in Synopsys Library Language (SLL; available from LSI Logic Corporation). The Memory Modeller reads the memory description and generates a complete timing description of the memory block. This contains all of the setup and hold values and the timing arcs and I/O pin characteristics. This task is similar to that of the Synthesis Library Model (SLM; available from LSI Logic Corporation) generator.

Mega-cells and mega-functions 608 are treated as basic building blocks, similar to the macro-cells in the synthesis library. Both are generally developed beforehand for optimal performance, so no optimization is required on these blocks. They are presented to the Design Compiler 604 simply to provide timing information so that the surrounding blocks can be optimized. The mega-cells are modeled in the same manner as the macro-cells, i.e. by using the Synopsis (SLL) library format. The mega-functions are ported into the Design Compiler in Synopsys DataBase (SDB) format. (The netlist back plane 610 is used as the primary design representation medium). Generally, the mega-functions model industry-standard functions, thereby providing the designer with a set of popular and proven standard building blocks. In the case of certain, highly-specialized, user-defined mega-functions, it would be necessary to ensure appropriate capability in the Design Compiler.

Random logic 612, in other words the remaining modules that were not synthesized using the previously described tools and libraries, are synthesized by a general purpose logic synthesis tool 614 that optimizes the design for speed and area. It accepts hierarchical combinational and sequential design descriptions in equation, truth table, net list and/or VHDL formats. The optimization process is directed by specifying the "goals". Goals are represented as timing constraints. The optimization process makes trade-off evaluations and produces the best possible gate level implementation of the design for the specified constraints.

Since the Design Compiler 604 provides an environment for synthesis and constraint-driven optimization, it can be used as the overall synthesizer/optimizer. Blocks created by other tools can be loaded into the Design Compiler, where the timing information from these blocks can be used to synthesize and optimize the surrounding logic. For example, knowing the drive capabilities and the skews of the memory blocks' outputs would allow for accurate optimization of the glue logic.

Figure 8:
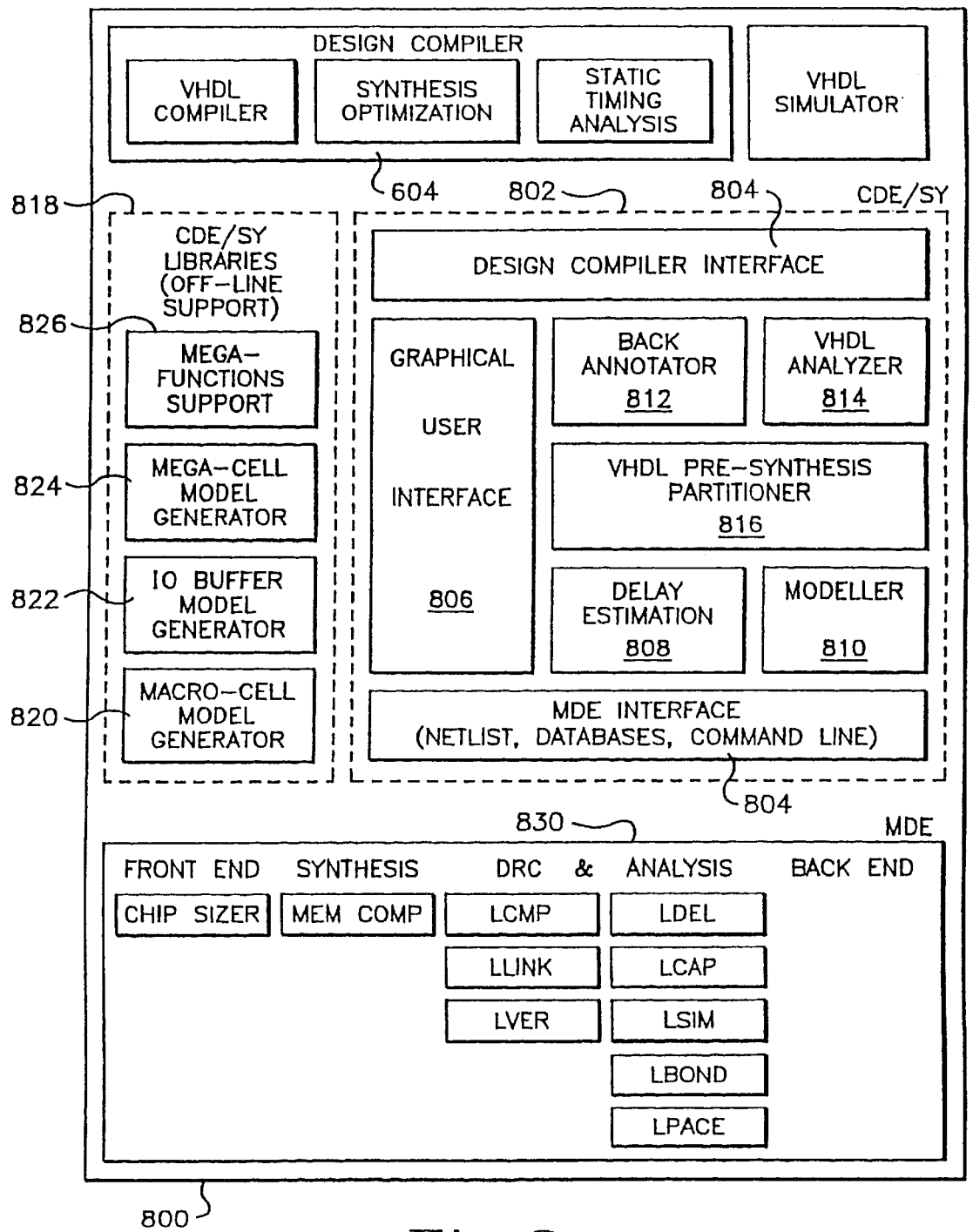
FIG. 8 is a block diagram of a suite of exemplary software tools for implementing the methodology disclosed in FIGS. 1–7.

Once the memory blocks are synthesized, and the appropriate mega-cells and mega-functions are chosen, the remainder of the design can be synthesized by the Design Compiler. Optimization is then performed according to user-defined timing constraints (see User Interface; FIG. 8) and those dictated by existing blocks. This is an iterative process. Constraints need to be refined until the desired timing and area requirements are achieved.

FIG. 7

Figure 7:
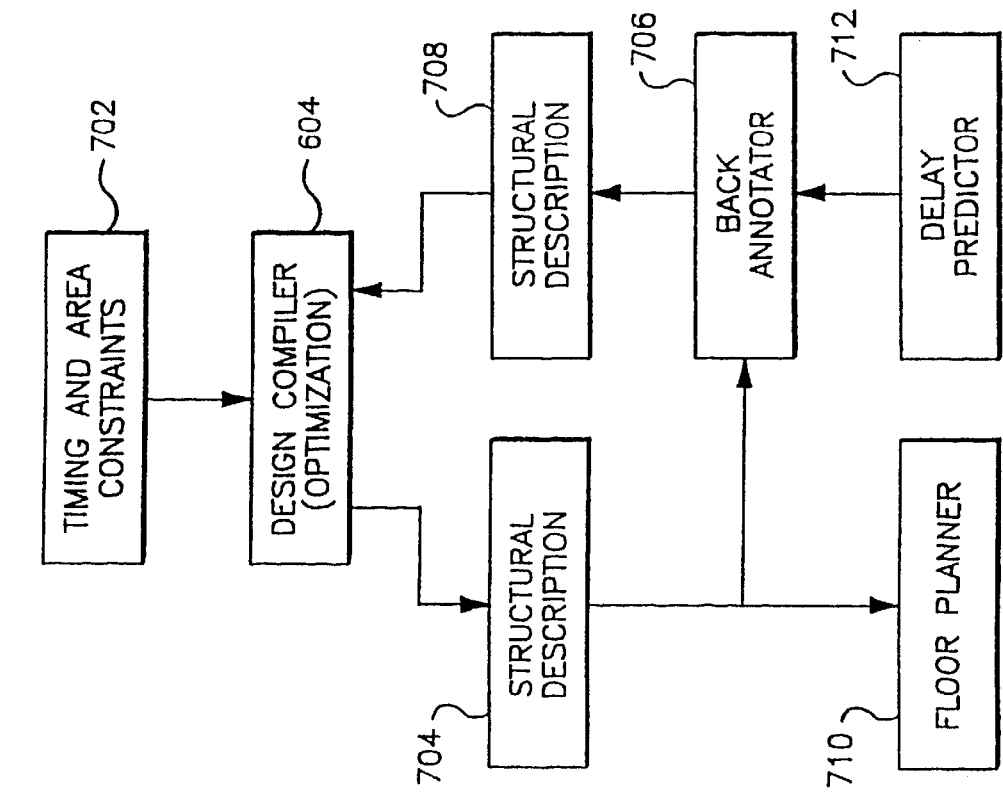

FIG. 7 shows a synthesis design framework. The objectives of the disclosed framework are: to provide a unified front end for a set of synthesis and optimization tools; to provide an integrated synthesis environment by incorporating specialized synthesis tools with the Design Compiler, which is the main synthesis and optimization tool; to provide the capability of constraints-driven gate-level optimization of both sequential and combinational designs; to provide back annotation of wire delays from the Modular Design Environment (MDE; available from LSI Logic Corporation, described hereinafter) to the Design Compiler to make the necessary timing/area trade-off evaluations based on more accurate wiring delays; to provide a window-based graphical interface between the synthesis tools and the MDE module to control the data flow between the Design Compiler, the other synthesis tools and the MDE; to provide VHDL debugging, and analysis capability to front-end synthesis from VHDL; and to provide VHDL pre-synthesis partitioning capability to front-end synthesis form VHDL.

Generally, the design framework illustrated in FIG. 7 follows from the design methodology described hereinbefore. The methodology includes the following important steps:

partitioning the design into memory blocks, mega-functions, mega-cells and random logic;

using a layout tool, such as LSI's ChipSizer (see FIG. 8), to obtain the required die size, which is a function of the area, the number of pins and pads and other factors;

choosing the mega-cells and mega-functions to be used, and characterizing the cells for the Design Compiler;

generating memory blocks, and characterizing them for the Design Compiler;

partitioning the random logic into smaller functional units;

using the Design Compiler to synthesize the remaining blocks, in a "bottom-up" manner, starting with the lower level functional units, including: verifying the functionality of the block using functional verification tools or simulators; optimizing the design for area or, in general terms, for timing of some or all of the selected paths; composing the higher level functional blocks and, when a functional block interfaces with an existing building block (e.g. memory, mega-cells, mega-functions), optimizing the functional unit (and all or some of its lower level units) according to the timing/area constraints 702 imposed by the building block; and repeating these steps until all of the functional units are synthesized into a structural description 704. The resulting structural description 704 may be back annotated 706 as a structural description 708 (of timing/area constraints) to the Design Compiler. In the loop shown:

for larger functional blocks, a floor planner 710 is used for placements and more accurate wire delay prediction 712 and, with this information, using the more accurate block size provided by the floor planner to re-estimate the internal wire delays of the lower level functional units and back-annotating these delays into the Design Compiler to provide more meaningful internal timing optimization, and/or using the wire delays of the inter-block buses and wires to derive the appropriate boundary constraints for timing optimization, i.e. to specify inter-block delays through constraint constructs; and incorporating the timing delays and drive capabilities of I/O buffers into the timing constraints. (The I/O buffers should be selected as early in the design cycle as possible.)

FIG. 8

FIG. 8 provides an overview of the design framework, illustrating an exemplary suite of tools, many of which are commercially available (as individual units), for implementing the methodology of the present invention. Herein it is important to note that the methodology of the present invention augments many discrete software tools, such as those described herein, and provides enormously increased functionality in the context of behavioral synthesis, which otherwise would not be available by simply combining these tools.

The design framework, hereinafter termed the Co-Design Environment (CDE) 800 is divided into two sections: on-line design tools and off-line design tools. The on-line design tools are programs that are utilized directly or indirectly by the user during the design process, and are relatively generalized to handle a variety of design objectives. The off-line design tools are programs that generate libraries and models of the various building blocks for the Design Compiler, and may be very user-specific.

A first group 802 of on-line tools, labeled CDE/SY, constitutes the dynamic part of the Co-Design Environment and includes the following:

A Design Compiler Interface 804 (shown in two parts) controls the data flow and interactions between the MDE and the Design Compiler 604. It enables the user to follow the process of the design from one environment to the other, and interacts with the MDE programs via script shells and a command line. Interactions with the Design Compiler are achieved through the dc-shell script and constraints files.

A Graphical User Interface (Graphical UI) 806 facilitates user interaction with the CDE by: abstracting out those steps of the design flow that do not require the designer's intervention, assisting and guiding the designer through the various stages of the design process as outlined by the synthesis framework, and assisting the designer in the composition of the constraints file for optimization.

A Block Level Delay Estimator 808 provides the optimization tool with pessimistic wire delays which, in turn, causes the optimizer to compensate by placing buffers in and around the block or to use high power gates all over the design, and is especially applicable to small functional blocks. An advantage of using the Block Level Delay Estimator is that in pre-place and pre-layout stages of the design, both the synthesis and the analysis tools consider the wire delays to be a function of fan-out only. Although this might be a good estimate for the purposes of analysis, it has some undesirable side effects on the optimization process. Usually, in the present methodology, optimization is performed on a functional block of less than a few thousand gates, but most existing wire delay algorithms (based on fan-out) are geared towards much larger, die-sized blocks. Hence the Block Level Delay Estimator provides more realistic estimates of wire delays for the block size being manipulated through the system, and provides appropriate tables (wire_loading) to be used by the Design Compiler.

A Memory Modeller 810 reads the net list of a memory block created by MemComp (See 602, FIG. 6), and generates a timing model (in SLL) to be used by the Design Compiler. The objective is to provide the Design Compiler with accurate timing information about the memory block. This will help the optimization process as the drive capabilities, the capacitive loads, and the setup and hold time of the memory I/O will automatically define some of the constraints for the surrounding logic.

A Delay Back Annotator (DBA) 812 comes into play after the floor planning stage, and provides more accurate wire delays into the optimization database. The DBA is used for two distinct purposes: 1) to back annotate wire delays for a block that is going to be re-optimized, using the latest (and most valid) delay values; and 2) to back annotate wire delays for a block that has been optimized and has met the design constraints, thereby providing the latest delay values for accurate modeling of the block so that surrounding blocks can better be optimized.

A VHDL Analyzer 814 provides source code (VHDL) debugging and assists in functional verification of the VHDL description. The VHDL Analyzer is discussed in greater detail in FIGS. 10 and 11, and in the annexed code listing.

A VHDL Pre-Synthesis Partitioner 816 partitions behavioral descriptions (VHDL code) into RTL descriptions of modules and sub-modules. During partitioning, appropriate architectural decisions are based on time/area analysis.

The off-line part of the CDE is a collection of libraries 818, which are either in SLL (Synopsis Library Language) or SDB (Synopsys Data Base) format. SLL is a dedicated language for modelling of cells or modules, and is most suitable for synthesis and timing (static) analysis. SDB (available from LSI Logic corporation) is the Design Compiler's database, and can contain a design description in a multitude of formats, including Boolean expressions, truth tables and net lists.

A Macro-Cell Model Generator 820 reads the structural description of the macro-cells from the MDE libraries and generates the appropriate models in SLL. The behavior of sequential cells may be modeled by the Model Generator, subsequently to be manipulated by the Design Compiler.

An I/O Buffer Model Generator 822 provides timing and drive capability information on the I/O buffers, which are modeled as ordinary macro-cells in the CDE environment. Data derived therefrom is used for optimization of the logic inside the chip. The Optimizer (Design Compiler 604) is not expected to manipulate the I/O buffers. This Model Generator is capable of handling configurable buffers, which are modelled as "n" cells, where "n" is the number of all the possible configurations of that buffer.

A Mega-Cell Model Generator 824 is similar to the Memory Modeler in the on-line portion of the CDE in that the objectives are generally the same. However, as mega-cells are static and do not change from one design to the other, this modelling can be performed in advance to create a synthesis mega-cell library.

Mega-Functions Support 826 provide the Design Compiler with timing information about the mega-functions. This helps the optimization process, since the drive capabilities, capacitive loads, and path delays of the mega-functions will define some constraints for the surrounding logic. Mega-functions are essentially "black boxes" from the user's point of view. Therefore, the Design Compiler is configured to prevent users from viewing or altering the mega-functions.

The various functions of the Design Compiler are shown in the block 604, and a VHDL Simulator (for behavioral and structural verification, discussed hereinbefore) is shown at 828.

Illustrative tools (ChipSizer, MemComp, LCMP, LLINK, LVER, LDEL, LCAP, LSIM, LBOND and LPACE), commercially available within LSI Logic's Modular Design Environment 830 are shown. Generally, these tools consist of a set of programs that compile, link, simulate and verify digital logic at the chip (structural) level. Any number of other, commercially available programs could be employed at this level to perform similar functions.

FIG. 9

Figure 9:
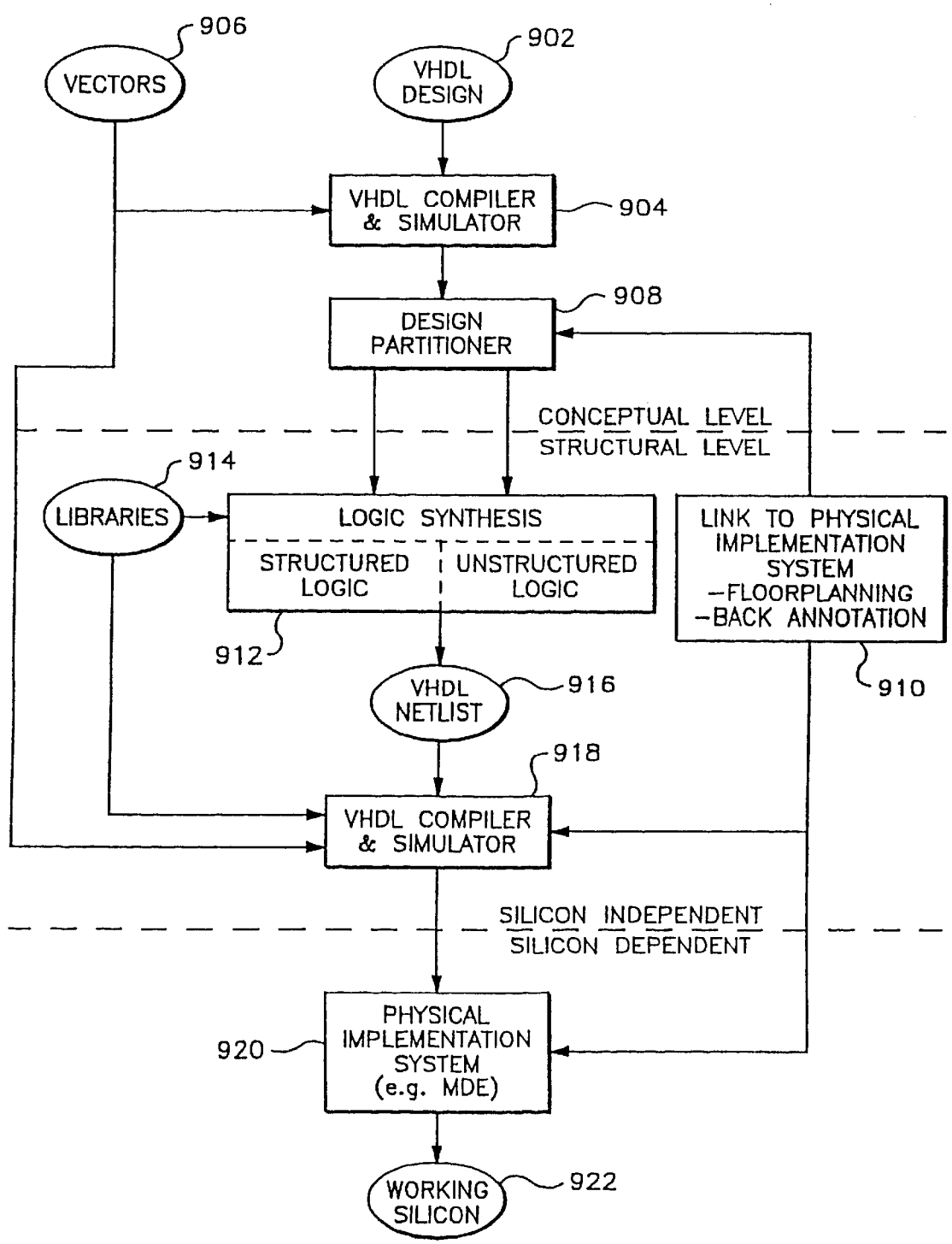
FIG. 9 is a block diagram of the methodology of the present invention.

FIG. 9 shows a more generalized arrangement of the methodology of the present invention, in such terms that one skilled in the art to which the invention most nearly pertains could readily implement the methodology.

At the conceptual level, a behavioral description 902 of the target device is formulated in a high-level language, such as VHDL. The behavioral description is compiled and simulated 904 using test vectors 906 to verify the design description. The behaviorally-verified design is partitioned 908 into suitable architectural blocks, as described above. Partitioning allows for the critical link 910 to the physical implementation of the target device, incorporating critical size (area) constraints (i.e. floor planning) and critical timing (speed) information (i.e back annotation).

At the structural level, the partitioned design is provided to logic synthesis tools 912 which formulate both structured and unstructured logic (functional blocks). Additional information regarding the functional blocks is derived from libraries 914. Importantly, the timing/area constraints introduced through the partitioner 908 are embedded at the logic synthesis stage. The output of the logic synthesizer 912 is a net list 916 for the target device, such as in VHDL, which is compiled and re-simulated 918 (904), using the test vectors 906 and pre-defined information about blocks contained in the libraries 914. If necessary, updated timing/area constraints are provided back through the partitioner 908 and the target device is re-synthesized 912 to meet the desired goals. By iteratively repeating this process, both the behavioral and structural descriptions of the target device can be fine tuned to meet and/or modify the design criteria.

At both the conceptual (behavioral) and structural levels, the design of the target device is technology (silicon) independent.

After a valid, verified net list has been described, the structural description of the target device is provided to a suitable silicon compiler (Physical Implementation System) 920, such as LSI Logic's MDE, to create a working device 922. At this stage, the tools required are technology (silicon) dependent.

FIGS. 10–11

Figure 10:
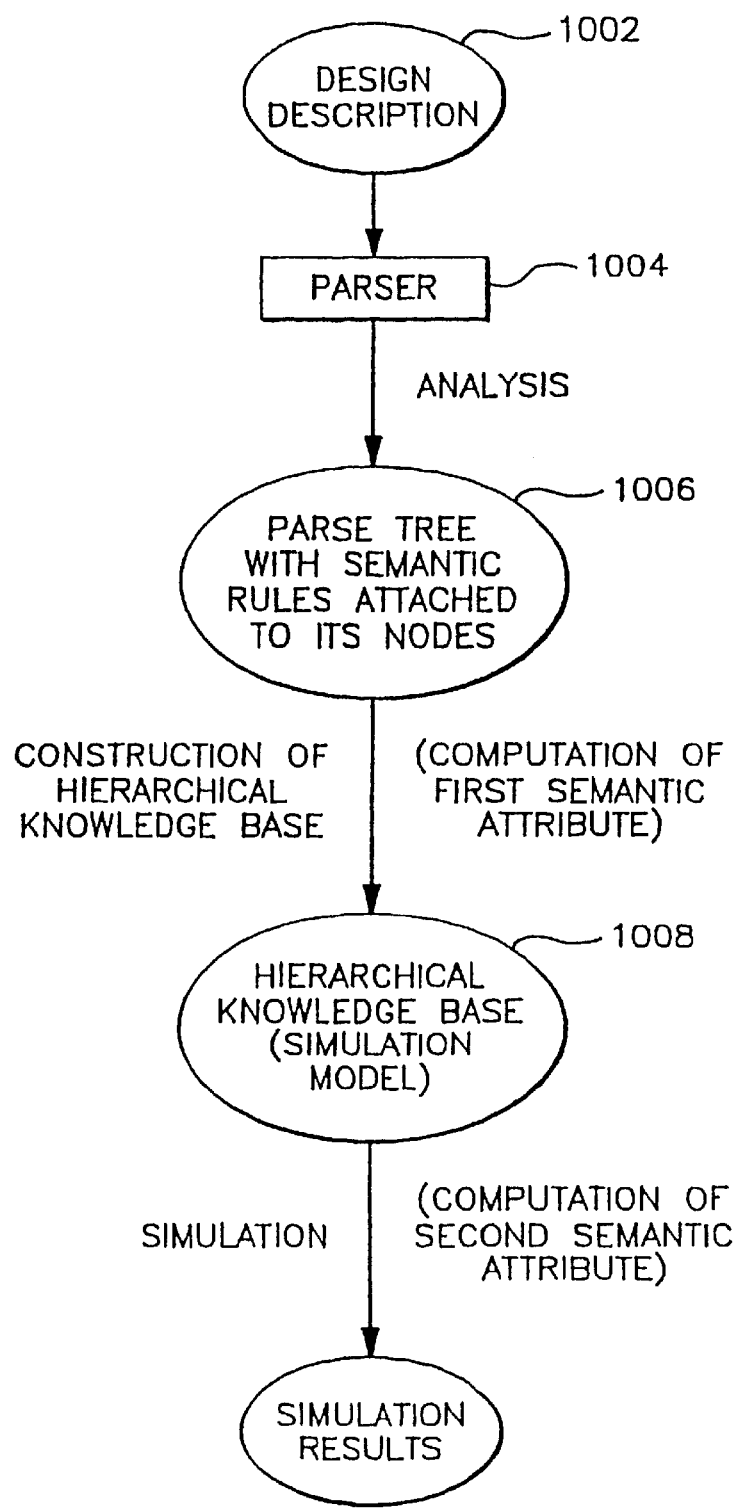
FIG. 10 is a block diagram of the Analyzer portion of the present invention.
Figure 11:
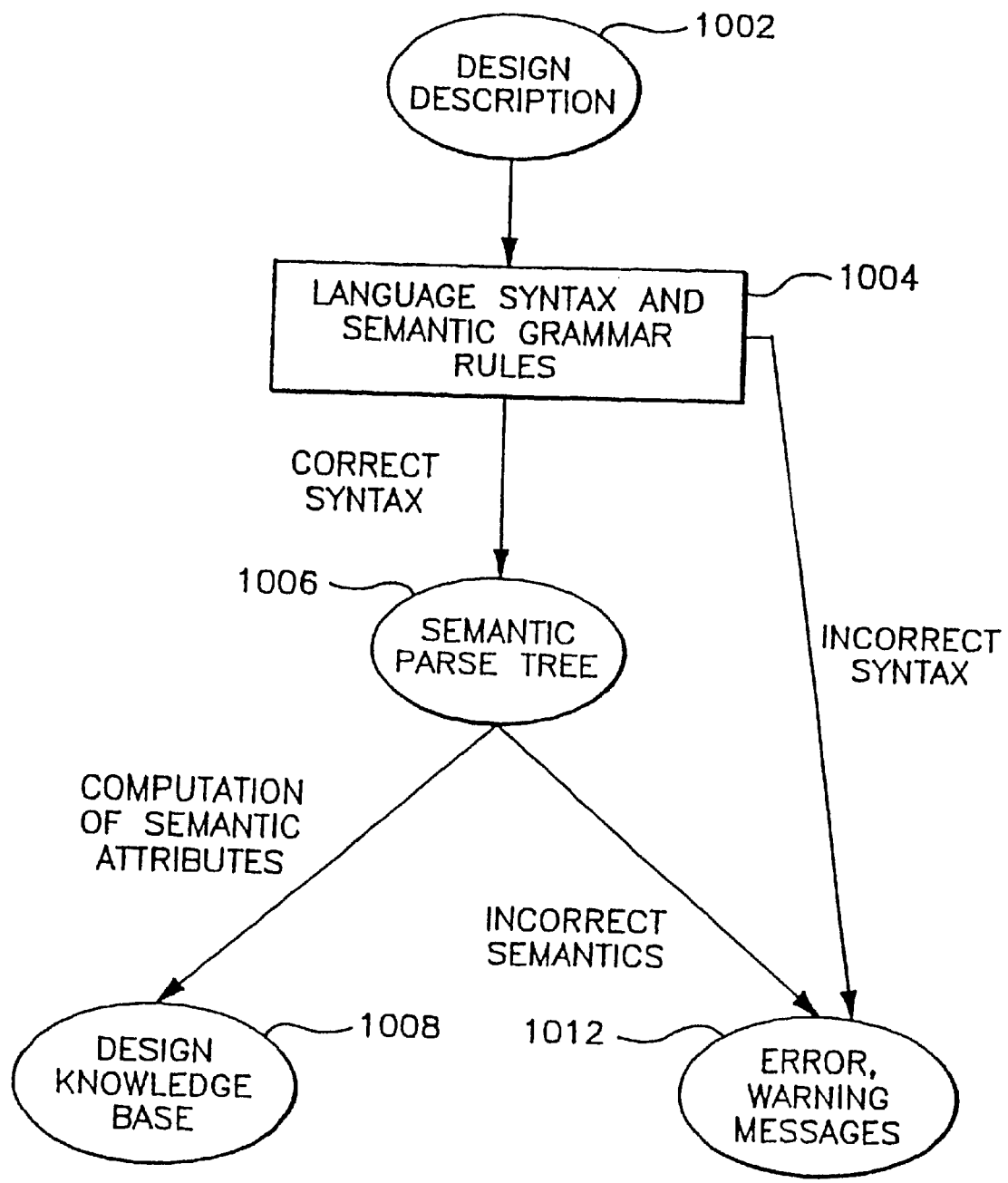
FIG. 11 is a block diagram showing the Analyzer

FIGS. 10 and 11 illustrate a hierarchical knowledge base approach to simulate hardware descriptions in a high-level Hardware Description Language (HDL). In this approach, a knowledge base is constructed corresponding to each functional block of the hardware description. The hierarchical relationships among the various blocks in the description is mapped on to the knowledge base corresponding to those blocks. The hierarchical knowledge base thus formed is used for simulating the hardware description. Unlike previous approaches to simulation and verification of digital circuits (devices) described in a HDL, there is no need for intermediate translation steps.

In the past, artificial intelligence techniques have been used in formal verification and hybrid simulation of digital hardware to address the problem of combinatorial explosion of exhaustive logic simulation. In one approach, structural and behavioral descriptions of a design are first translated into first order clauses in Prolog. This set of clauses asserted in a Prolog data base can be viewed as a "flat" knowledge base. The hierarchy in the design is enforced implicitly by suitable relationships among the assertions in the knowledge base. A theorem prover is then used to establish the equivalence between the structural specification and the behavioral description to formally verify the design as represented by the data base. This approach has the disadvantages of translating a HDL description of a design into first order clauses and maintaining a large knowledge base which is difficult to manage for complex, hierarchical systems. In another approach, hybrid simulation is used to verify digital designs. the design is described as an interconnection of functional modules in a first order language, such as Prolog. The design may be hierarchical with the lowest level being Boolean gates. It is then simulated with both numerical and symbolic input signal values. This, again, has the drawback of having to maintain a large Prolog description for complex hierarchical designs.

The present methodology differs from the previous approaches by not having to go through intermediate translation steps, and not having to maintain a Prolog description of the design. Generally there are three steps in the present methodology:

- Analysis, wherein the input description is analyzed for syntactic and semantic correctness, and a parse tree is formed. Each node in the parse tree is associated with a semantic rule.
- Construction of the hierarchical knowledge base, wherein the semantic rules associated with nodes of the parse tree are used to construct a knowledge base for each block of the description, and the hierarchical relationships among the knowledge bases are derived from the semantic rules. The knowledge bases contain simple assertions and methods to compute functions and procedures present in the source description. The also make up the basis for other design tools.
- Simulation, wherein using these simple assertions and computation methods contained in the knowledge bases, the output signal values are calculated for a given set of input signal values. The input stimulus can be either symbolic expressions or numerical values.

FIG. 10 shows the steps in simulating a design description.

Beginning with a design description 1002 written in a formal, high-level language, the description is analyzed (parsed) 1004 using, for instance, definite clause translation grammars (DCTG) to form a parse tree 1006. In the parse tree, semantic rules are attached to each node. Each syntactic rule for the formal (high-level) language is associated with one or more semantic rules. Preferably, two semantic rules are associated with each syntactic rule—one of the semantic rules is used to verify the semantic description of the description, and the other semantic rule is used to simulate the description. Each rule has a semantic and a syntactic part. The semantic part has two attributes, namely, "check_semantics" and "execute". The semantic rules specify how these attributes are computed and verified. Using this technique, it is not necessary to go through intermediate translation steps to analyze and execute a description. Rather, the methods of analysis and execution are specified in conjunction with the syntactic rules of the language.

After a successful parse of the given description, each node in the parse tree thus formed is associated with the attributes as specified in the DCTG rules of the language. The computation of an attribute attached to a node can be a recursive transversal of sub-trees associated with the node. For semantic analysis, one semantic attribute verifies whether any semantics of the language is violated, and error messages (see FIG. 11; 1012) would be generated. These violations include redefinition of objects within the same scope and incorrect argument types to a procedure. Only a correct description is passed on to the hierarchical knowledge base 1008. Thus the analysis of the description ensures that it conforms to the syntax and semantics of the HDL description, and leads to the construction of a valid hierarchical knowledge base.

The hierarchy in a design description can be of two kinds. One is imposed by the structural design description in which a design entity (component, process, function, architecture, configuration) is composed of several other design entities. The second relates to scoping and visibility rules of the language. The knowledge base 1008 is formed, i.e. one knowledge base for each design entity, after the syntax and semantic analysis of the input HDL description. Each knowledge base has a set of unit clauses which correspond to all the static declarations, default values of signals, variables and the data structures necessary for simulation corresponding to the design entity. The hierarchical relationships among the knowledge bases are automatically derived while analyzing the design description using the DCTG rules of the HDL. this corresponds to a direct mapping of the hierarchy in the hardware design description. The need for a hierarchical knowledge base also arises due to the scope and visibility rules of a formal language that is being analyzed. The scoping and visibility rules are also used to determine the relationships among the design entity knowledge bases. The hierarchical knowledge base 1008 makes up a simulable model of the design. Other design tools such as synthesis and partitioning tools (discussed hereinbefore) also use the knowledge bases for extracting design information.

In the past, because of the scope and visibility of the rules of a formal language, in both translation and compilation, every identifier is given a unique names. However, in the case of simulation, when the description is being executed directly, this technique is not feasible.

The description contained in the knowledge base may contain different levels of abstraction of hardware design, namely, behavioral, RTL and gate level descriptions. Simulation involves execution of all the functions, procedures and processes for generating transactions on the drivers. A driver is associated with every signal that appears in a signal assignment statement and is represented by a sequence of transactions (each transaction is a value/time pair). Generating transactions, ordering them according to certain constraints, and scheduling them at a certain time is the key to simulation. The input test vectors for simulation are asserted in the knowledge base corresponding to the design entity in which the input signal appears. The test vectors can be either symbolic expressions or numerical values. The DCTG rules are again applied to the simulation data structures stored in the knowledge bases, and a second semantic attribute ("execute") is computed. this set of semantic rules constitutes the simulation engine. It includes computation of values of arithmetic expressions, Boolean expressions, symbolic expressions, time expressions, execution of sequential and concurrent statements, and generation of transactions. the computation is ordered by the simulation semantics of the language in conjunction with the hierarchical relationships. After generating transactions for all drivers, they are ordered with regard to time, synchronicity and simultaneity. As simulation time advances, the drivers update the values of the associated signals. This causes events to occur on the signals which may cause certain processes to "wake up" and in turn lead to the occurrence of more events. The next step is to schedule the events on the signals. This is handled by a scheduler which looks at the event ordering and generates unit clauses related to the time, signal and value of a scheduled event. The final step is to assign the value to the signal at the appropriate time.

It may happen that there could be multiple drivers due to multiple signal assignments in the source description. For the same signal, multiple drivers might try to assign values at the same time. In such a case, the value is resolved by a resolution function associated with the signal, and the resolved value is assigned to the signal. This leads to unit clauses which give the final resolved values of every signal present in the design description, in the simulation results 1010.

FIG. 11 is an overview of the types of rules, described above, for defining the correct relationship between objects in the constructed knowledge bases, for converging to correct structural representations of behaviorally-specified designs, and for enforcing a "good" style of VHDL code leading to the correct structural representations.

Prolog provides a useful tool for implementing the described methodology. Prolog grammars such as DCTG are useful in associating semantic rules with syntactic rules of the hardware description language (e.g. VHDL), and the inference engine contained in Prolog makes it straightforward to handle derivation of the inter-relationships between the different entities in the knowledge base.

The hierarchical knowledge base, described above, helps maintain the hierarchical nature of large hardware designs and permits large hardware descriptions to be directly simulated without having to go through intermediate translation steps. The knowledge base can be used by other tools, such as those set forth above.

An executable listing of the Analyzer/Interpreter, as described with respect to FIGS. 10 and 11, can be found in parent U.S. patent application Ser. No. 07/507,201, and is incorporated by reference herein.

FIGS. 13–15

FIGS. 13 through 15 show representative screen displays of the methodology of the present invention, as they would be presented to the user. In the main, the display of FIG. 13 is discussed.

In the lower left "window" of the display of FIG. 13 is shown a VHDL description of a counter ("while x<a loop . . . "), created by the user. The user then simulates the code, at the high-level, to ensure that it the description is correct, by providing operands ("variables").

The system then creates "data flow", relating to the sequencing of operations and the parallel or serial configuration of functional blocks required to realize the counter, and presents the results to the user in graphical and/or textual form. In this example, seven design alternatives are displayed in the upper left window ("Design: [[1] . . . "). One of these design alternatives, selected by the user for viewing, is displayed in the upper right window (as interconnected circle and square primitives) In the lower right window is displayed the estimated area that would be required to implement the design, and is technology dependent. Also displayed in the upper left window are estimates of functional units (registers, muxes) that would be consumed by the various design alternatives. This all relates to exploring the design space, and allows the user to perform a "what if" analysis for choosing a preferred design in terms of size, speed, performance, technology and power. (In the upper left window of FIG. 15 are shown size estimates for particular functional blocks labelled "8.1", "11.1", etc.) All of the above is performed prior to any synthesis, to allow the user to make intelligent trade-offs leading to a viable design, by interacting at the architectural level.

By partitioning, accurate timing estimates can be derived as discussed hereinbefore (not shown in the screen displays).

Summary

A methodology is described for the implementation of complex digital systems. The methodology includes:

a) a mechanism for semantic capture of the specification and description of the digital hardware for which an implementation is desired;

b) hardware descriptions embodied in a specification language, such as VHDL (or VHDL Intermediate Format), having well standardized semantics;

c) utilization of an appropriate software language, such as Extended Definite Clause Grammar (EDCG) and Prolog, for formal capture of the semantics of b);

d) direct execution of the semantics and of the behavior of the hardware described in a) and b);

e) execution of the intent contained in the description of a) without a translation step, such as with Prolog and its predicate logic formalism (knowledge representation of the digital hardware is achieved via the imbedding provided by predicate logic, semantic description of EDCG, Prolog and the VHDL language);

f) system level partitioning for creating optimized versions of hardware functional blocks for trade-off display, predicting for estimating hardware resources (sizes), speed and power, and mapping from one level of design representation to another;

g) isomorphism among various levels of partitioned hardware (across semantics, structure, behavior, logic and functions);

h) synthesis of hardware directly from semantics and intent contained in a) through f) into low level structural logic descriptions;

i) methodology for closure between the timing goals of a) through g); and j) methods for displaying knowledge in a), d), e) and f).

One skilled in the art to which the present invention most nearly pertains will readily be able to implement the invention based on the description set forth above. The above-described embodiment is set forth in terms of exemplary, well known logic synthesis tools, especially for deriving the structural representation and physical implementation from the RTL description of the device being designed. Other implementations would largely be driven by the particular technologies and logic synthesis tools that may be employed.

Code listings for the Partitioner program (441 pages), the Synthesis Controller program ("SYN CONTROLR") which is a background program that processes the functional calls from the VHDL description of blocks (see FIG. 6) to memory blocks, mega-cells, mega-functions and other arithmetic unit functions in MDE and replaces these blocks by a component that can be simulated and merged (443 pages), and the "LIVE" (LSI Intelligent VHDL Environment) program, which is the Analyzer referred to hereinbefore (178 pages), are appended to parent U.S. patent application Ser. No. 07/507,201, and are incorporated by reference herein. These listings are all in executable code converted into hex through a standard UNIX utility.

With regard to FIGS. 1–15, there has been described a methodology for generating structural descriptions of complex digital devices from high-level descriptions and specifications is disclosed. The methodology uses a systematic technique to map and enforce consistency of the semantics imbedded in the intent of the original, high-level descriptions. The design activity is essentially a series of transformations operating upon various levels of design representations. At each level, the intended meaning (semantics) and formal software manipulations are captured to derive a more detailed level describing hardware meeting the design goals. Important features of the methodology are: capturing the users concepts, intent, specification, descriptions, constraints and trade-offs; architectural partitioning; what-if analysis at a high level; sizing estimation; timing estimation; architectural trade-off; conceptual design with implementation estimation; and timing closure. The methodology includes using estimators, based on data gathered over a number of realized designs, for partitioning and evaluating a design prior to logic synthesis. From the structural description, a physical implementation of the device is readily realized.

Further refinements to the methodology disclosed in FIGS. 1–15 are described hereinbelow. One skilled in the art to which the invention most nearly pertains will recognize that, although these refinements are particularly well-suited to implementation in the methodology of FIGS. 1–15, they may more generally be applied to other design methodologies that operate at various levels of abstraction.

Top-Down Design Methodology

In general, the system design of a chip (or other complex electronic system) requires that a number of milestones be completed during the design process. Some of these milestones are:

a) Architectural definition and design completion
b) Behavior definition and design completion
c) Functional definition and design completion
d) Logic definition and design completion
e) Timing definition and design completion
f) Physical definition and design completion (area, topology, floorplanning routing)
g) Power definition and design completion
h) Test definition and design completion
i) Package definition and design completion Many of the tasks involved in meeting these milestones are inter-dependent. To accomplish them it is necessary to iterate among them. Trade-offs among the various definitions need to be done against some of the design goals and design constraints.

It is an object of the present invention to provide a technique for top-down design which achieves convergence of all the design tasks associated with meeting the above design milestones to meet design goals, constraints and specifications.

Current practice is to achieve the various design milestones a) through i) iteratively (i.e., by trial and error) with little or no direct information about the impact of the method used to achieve one milestone on the achievement of subsequent milestones. This "hit-or-miss" approach becomes extremely time consuming as system complexity increases.

According to the invention, a matrix of project milestones versus hierarchical level of design is created, thereby creating an array of hierarchically-related compound milestones. Completion criteria are defined for each entry in the matrix. Assuming that project-related milestones (project phases) progress from left-to-right across the matrix, and that the highest hierarchical levels are at the top of the matrix and progress downward, the inventive technique seeks to achieve the compound milestones in the matrix generally from top-left to bottom-right in a monotonic, unidirectional fashion using continuous refinement. Single level or multi-level estimators (predictors) are used to indicate the direction of progress.

Figure 16A:
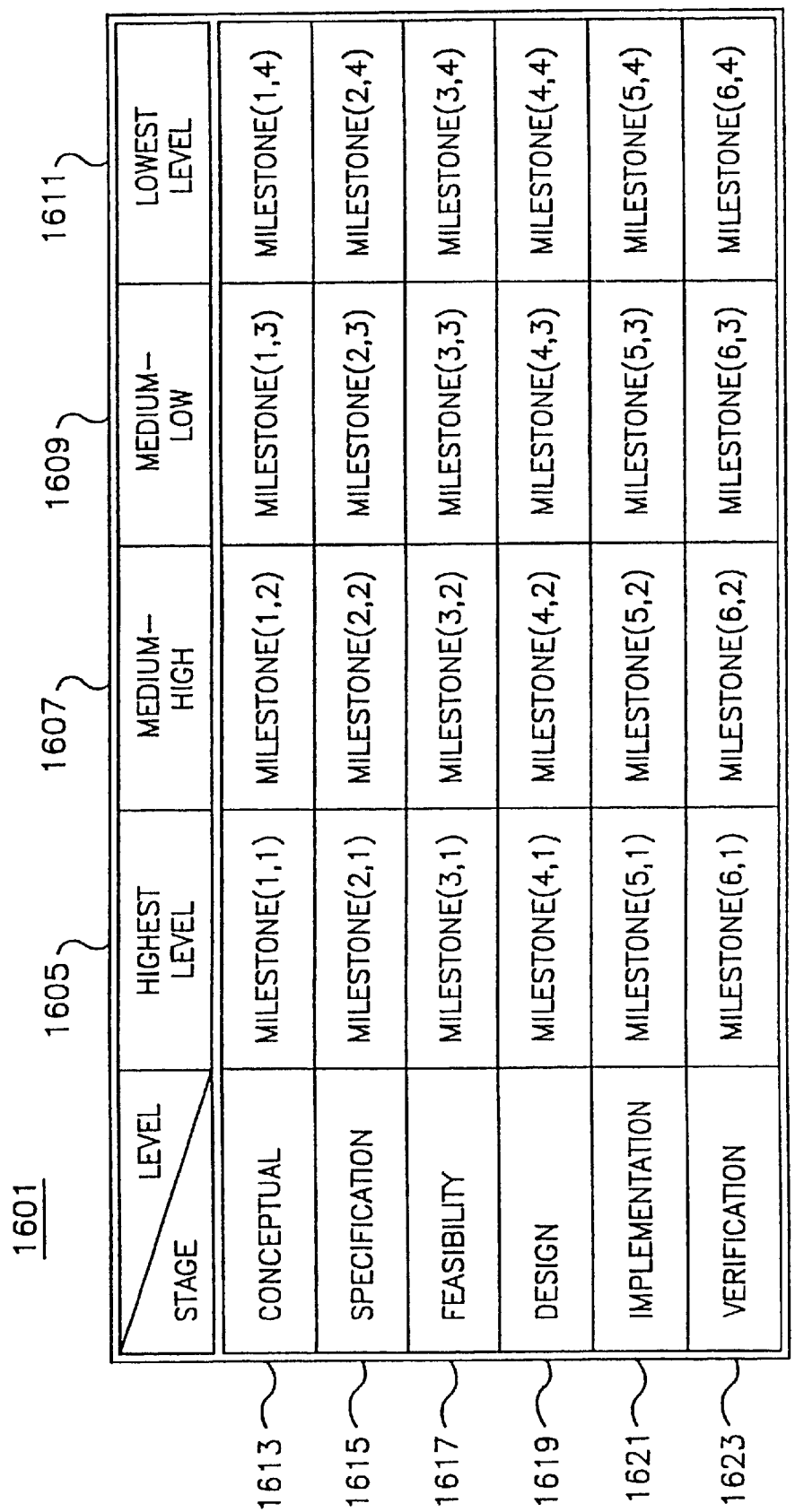
FIG. 16a is a chart of a generalized milestone matrix illustrating a top-down design methodology of the present invention.

In a preferred embodiment of the present invention, levels of top-down design abstraction are mapped to stages of design development as shown in FIG. 16a. The horizontal rows in matrix 1601 represent various stages of the design process, and the vertical columns represent levels of design abstraction. Each matrix element corresponds to a milestone which must be completed in the progression from the system-level conceptualization of a design to the culmination of the design process with the verification of the lowest level of design abstraction.

The matrix 1601 is a generalized milestone matrix. All design processes (levels) have the six design stages 1613, 1615, 1617, 1619, 1621, and 1623 in common. The manifestation of the stages varies from discipline to discipline, but the fundamentals of the stages are the same across all disciplines.

Similarly, the top-down design methodology is common to most (if not all) design disciplines and applicable to most (if not all) design projects. Top-down design is characterized by the division of the solution to a problem into increasingly detailed, but smaller and therefore more manageable, sub-solutions. In FIG. 16a, divisions are mapped onto abstraction levels 1605, 1606, 1609 and 1611. Because matrix 1601 is a generic matrix, no discipline-specific labels have been given to the columns. Each column represents a refinement over the column to its immediate left.

FIG. 16b shows a milestone matrix 1625 for an ASIC design system. Columns 1629, 1631 and 1633 all represent three different levels of system level abstraction. System level abstraction is the block diagram description of the system. Columns 1635 and 1637 represent different levels of behavior/architectural level abstraction. In the behavioral/architectural level, some interconnections between blocks are defined and the blocks are given some functional definition. Columns 1639 and 1641 represent different lower-level Micro-architecture levels of abstraction. Micro-architecture refers to the RT level of abstraction. Column 1643 represents logic level abstraction. Logic level is typically the same as gate level.

Rows 1645 through 1655 represent the conceptual stage, the specification stage, the feasibility analysis stage, the design stage, the implementation stage, and the verification stage, respectively.

Each matrix element (matrix elements are referred to herein by an x,y coordinate composed of the reference numerals of their associated row and column in the matrix) represent a milestone which must be completed. The simultaneous satisfaction of the completion criteria for of all milestones in the matrix indicates the completion of the system design.

Associated with the milestones in the various matrix elements are transitions which cause the completion of adjacent milestones. The transitions are enabled when the source milestone is completed. For example, matrix element (1645, 1629) represents the System Block Diagram milestone. Upon completion of the milestone, the user interface (described below with respect to FIG. 17) indicates that the milestone has been completed by shading a representation of the matrix element associated with the milestone on an icon of the matrix.

Definitions for Milestone Matrix Example (ASIC Design)

FIG. 16b illustrates the milestone matrix in the context of an Integrated Circuit Design. The following section defines the various stages of design development and their corresponding milestones. Traversing from left to right in each row (each stage), a given matrix element (milestone) is always a refinement of the matrix element which is to the left of the given matrix element. For example, in the first row, the first element is the system block diagram, which is a very abstract description of the system in terms of blocks. The element to its right, the architectural and functional description milestone, represents a first-level refinement of the high-level system block diagram into a more detailed form. Traversing from top to bottom in a column, each successive milestone represents a further step towards project "completeness".

Project Stage Definitions:

Conceptual Stage (1645):

At the completion of the conceptual stage a system block diagram has been defined. It has been given an initial partitioning with some definition as to the behavior of each block, both in terms of inputs and outputs and in terms of behavior code. Furthermore, the blocks and ports have been given names and some attributes and decisions have been made on what will be implemented in memory and what will be implemented as logic. Finally, the decision has been made as to which elements can be reused from prior designs and which should be developed from the ground up.

Specification Stage (1647):

At the completion of the Specification stage, the blocks which make up the system have been identified and given functional specification. Furthermore, the system constraints as well as some of the logic that the developer should use to implement the system have been specified.

Feasibility Stage (1649):

The Feasibility stage uses estimator tools to determine whether the concepts developed in the conceptual stage can be implemented using the specification which was defined in the specification stage. At the end of the feasibility stage, the design feasibility has been examined at all levels of design abstraction and certain optimizations and "what-if" analysis tradeoffs have been conducted. The result is a specification which has been deemed feasible. The advantage of employing a rigorous feasibility check at a high-level of abstraction at an early stage of design development is that it avoids pursuing designs that will never work.

Implementation Stage (1653):

In this stage, the design is reduced to practice. At the completion of this stage, there is a (hopefully) working system. The following stage, verification, is a check to make sure that the matrix of milestone operated as designed. If the matrix of milestones can be operated with 100% confidence, the verification stage is not necessary. However, while that is a desirable goal, the requirement for having system that have been rigorously tested makes it equally desirable to execute the verification stage.

Verification Stage (1655):

In the verification stage, all aspects of the working system are tested and verified. Upon completion of this stage, all project activities (excluding production) are complete.

Milestone Definitions:

NOTE: Milestones elements (ME's) are identified by their stage/level coordinates in FIG. 16b (e.g., ME(1647, 1639) is the Timing, Area and Power goals milestone).

ME(1645, 1629): System Diagram

In this milestone the developer creates an initial conceptual design of the system. It is a pictorial description of the system components in terms of blocks which have some function. In an example from computer systems, the system block diagram may contain a CPU, I/O units, a memory, memory controller, and a bus.

ME(1645, 1631): Architecture and Function

Function refers to that each block diagram is assigned a function and architecture means that the blocks are given some ports for communication with other blocks and with units external to the design.

ME(1645, 1633): Functional Partitioning and Chip Partitioning.

Create an initial partitioning of the system block diagrams. Using the design of a computer system as an example, the initial partitioning the system may be based upon a decision as to which blocks will be implemented in logic and which will be implemented as memory modules (e.g. ROM, EPROMS, FPGA). The system block diagram is refined into sub-component blocks. An example of chip partitioning could be a decision that certain of the blocks will be developed as ASICs (Application Specific Integrated Circuits) and standard modules will be used for certain other blocks.

ME(1645, 1635): Partition into Logic and Memory.

Further refinement of the block diagram. It is a partitioning into what is logic and what is memory.

ME(1645, 1637): Preliminary Functional System Vectors (Test Bench)

The relationship between inputs and outputs. This milestone is a functional definition of the system in terms of input and output, i.e., given a particular input the system should produce a corresponding output. An example is from MPEG (an industry standard for digital video compression and manipulation) wherein input definition would be a video image and the output another video image which would be the result of the manipulations done by the system.

ME(1645, 1639): Preliminary RTL Description:

In this milestone each block, either from the system block diagram, or from the further refinements from columns 1631 through 1637, is given a behavioral description in a behavioral description language (e.g. VHDL) defining the functional behavior of the block.

ME(1645, 1641): Entity/Port/Interface Definition:

Assignment of names to the blocks and ports. Furthermore, certain attributes are assigned to the ports. For example, a given port may be given the name "Port A" and the definition that it is a 16-bit integer port. In other words, the block diagram is given some properties.

ME(1645, 1643):Existing Modules or Designs:

For each block decisions are made on whether to import an existing design or whether to design it from scratch.

ME(1647, 1629): Block Definition and Behavioral Description:

A more detailed description of the behavior of the blocks that were defined in milestone (1645, 1629). For example, if the developer is dealing with an MPEG system the block definition may be a few lines of MPEG code defining how pixels are to be manipulated by the blocks. However, this description does not achieve the detail on how to do that manipulation in terms of logic.

ME(1647, 1631): Block Functional Specification (behavioral):

A detailed specification of the system behavior in functional terms. This is the reference point to which the design must conform in terms of function.

ME(1647, 1633): System Timing Goals, Constraints.

In this milestone the developer definition of the system level goals for timing, circuit area and power consumption for the blocks defined in the block diagram. Furthermore, in this milestone boundary conditions are given for each block and interface signal.

ME(1647, 1635): System Data and Control Flow Specifications:

This milestone is a break down of data and control and control signals for all the blocks in the block diagram. It defines the flow of data and control signals between the various blocks.

ME(1647, 1637): Number of Chips and Packages, Specification:

This milestone represents the specification of the number of chips used to implement each block. Furthermore, it is a definition of how many packages to be used and the specifications for those packages. An example would be: "chip number 3 includes blocks a, b, and c, and will have 64 pins and will fit into package X." This is a very important milestone in that from the definitions given herein it is possible to estimate the cost of the system.

ME(1647, 1639): Micro-architecture Timing, Area and Power Goals:

This milestone is a first specification of the system at the RT level. It is a specification of the goals for timing, area and power. However, being at the specification stage, it is not yet determined whether those goals are achievable (feasible).

ME(1647, 1641): Block RTL Specification (simulation), Timing v. Area Specifications:

The completion of this milestone represents that the RT level code has been completed, debugged and is stable. The code is verified as correct be RT level simulation. The timing and area specification for the various elements in the system design is also finalized in this milestone.

ME(1647, 1643): Logic Definition Cost Specification and Critical Path Specification:

One possible transition to this milestone from the block RTL specification milestone is through logic synthesis (however, in the context of this milestone matrix, synthesis is more appropriate at the implementation stage). In this milestone, the developer does a logic definition of the system and a cost specification. This milestone is achievable from the previously completed milestones, because the developer has a good idea about which gates will be used and where they will be used. The logic definition places the specification in context of defining some aspects of the logic which will be used to implement the specification.

ME(1649, 1629): Block Definition and Behavioral Description: ASIC Partition

There are many different options for developing a given design. At the extremes of the spectrum of options are, for example, the system will be implemented entirely in ASICs and the system will only use standard products, respectively. The ASIC partitioning milestone defines which blocks will be developed as ASICs and which blocks will be standard products. This decision is important because the degree of integration has an impact on the cost of the final product.

ME(1649, 1631): Board and Package Size and Speed Estimation.

This milestone uses estimators to determine whether it is possible to achieve the specified board and package size and speed constraints. The estimators can also be used to determine what packages to be used, what speed to use and how much speed to trade-off for area.

ME(1649, 1633): "What-if"-analysis; System Tradeoff Analysis:

In the "what-if"-analysis milestone, the developer uses, for example, the architectural exploration tool to determine how various design decisions impact various properties of the system. For example, the introduction of redundant functional units may improve speed but increases both area and cost, while potentially decreasing reliability.

ME(1649, 1635): Board Floor Planning:

This milestone represents an estimation of the board area used by the design. The term "board" is used here in a broad sense and encompasses, for example, printed circuit boards, multi-chip modules (MCM) and ASICs. An MCM is a module in which ASICs are laid out on a common substrate. By placing the ASICs on a single substrate it is possible to reduce the output driving capacitances, because these were designed to drive at the board level. Thus, having the option of putting the ASICs on a common substrate provides the designer with an additional parameter which may be used in optimizing the design with the goal of satisfying some constraints.

ME(1649, 1637): ASIC cost, Size, Speed, Power Feasibility:

In this milestone the developer analyzes the feasibility of all of the ASICs in the system.

ME(1649, 1639): ASICs area, Speed, Power Feasibility:

While the preceding milestone deals with the determination of whether the design on the whole is feasible given the specification of the various ASICs in the design, the present milestone is focused on the feasibility of individual ASICs. Furthermore, the developer uses exploration tools to do what-if-analysis on the design of each ASIC.

ME(1649, 1641): RTL Synthesis-Optimization (estimation only):

The what-if-analysis of the preceding milestones may reveal that there is some problem with the design, e.g., some constraints have not been satisfied. In the RTL Synthesis-Optimization milestone, the developer looks to the preliminary RTL description of the design to find ways to optimize the design so that the constraints will be met in the final design.

ME(1649, 1643): Logic/function/technology Feasibility:

In the preceding milestones estimators are run at a high-level of design abstraction. These estimators have been some inaccuracies. For that reason, it is beneficial to estimate the same properties at lower levels of abstraction, where more parameters are defined, to verify the correctness of the results obtained at the higher levels, thereby obtaining a lower level verification of the feasibility of the specification.

ME(1651, 1629): Block Definition and Behavior Description: ASIC(s) Behavioral Design:

The inputs to the Design stage are the block diagrams, the partitioning, the behavioral code, ASICs behavior have been completed and stabilized. These are used in the Design stage to arrive at a completed functional design, which in turn will be used for the global net list generation.

ME(1651, 1631): ASIC(s) RT Level Design Completion:

This milestone represents the completion and stabilization of the RT level design of the ASIC(s).

ME(1651, 1633): System Function Design:

The system functional design milestone is very important in that it represents the conclusion of the functional design of the system. At the conclusion of this milestone all the pieces of the system have been given complete functional descriptions. This functional description can then be used to generate the global net list.

ME(1651, 1635): Global Net List Generation:

This is a synthesis step from the functional description of the-system. All the blocks for all the components are merged into one system and are interconnected. This is a key milestone in that having a global net list it is possible to simulate and emulate the system.

ME(1651, 1637): System-level Emulation, Simulation:

Having a completed global net list of the system it is possible to emulate and simulate the design. Emulation is crucial because it enables software developers to begin developing programs for the system before the system has actually been physically implemented. Furthermore, at this milestone it is possible to execute the "test bench" defined in milestone (1645, 1637). At this level additional test may be run. The emulation/simulation may be used for regression testing.

ME(1651, 1639): ASIC re-partitioning (timing):

This milestone represents the beginning of the designing for timing. The prior milestones are directed towards designing for functionality. However, a completed system design must also be designed with timing in mind. In the ASIC partitioning milestone, a partitioning for timing is conducted. The purpose of this re-partitioning is to place blocks on the critical path close to each other or even inside the same partitions.

ME(1651, 1641): Critical Path Analysis, Constraints and Design:

At this milestone the developer examines the design at the gate level to do critical path analysis. Further, in this milestone the developer checks how well the critical path satisfies the constraints. The developer may further redesign elements on the critical path to improve the performance of the system.

ME(1651, 1643): Chip Design (area/speed) & Test Design:

In this milestone, the developer begins designing for testability (design-for-test). Design-for-test signifies that logic is added to the design so that the finished product can be tested.

ME(1653, 1629): Behavioral Technology Binding:

This milestone represents the completion of binding the behavioral functional description into particular operators.

ME(1653, 1631): RTL Technology Binding:

At this milestone, specific control elements are assigned to the control logic in the RT level description of the system. Prior to this milestone a given multiplexer used to control the input to a register element may have been described as a 5-to-1 mux, a rather generic term. At this milestone the same 5-to-1 mux may be bound to be, for example, an MUX51H, a non-inverting 5-to-1 mux in the LCA100K/LEA100K technologies, from the LSI Logic Corp.

ME(1653, 1633): Optimization

In this milestone, the developer does some fine-tuning of the design.

ME(1653, 1635): Synthesis and Optimization.

In this milestone, optimization of the circuit is done through a synthesis. This synthesis is conducted without any redefinition of the functionality of the design, i.e., there is no change in the behavioral code or in the RT level code. At this stage and level, the gates are known and the critical path is known. So the synthesis process can be directed to attempt to rebind in such a way as to achieve a little bit better performance on the critical path. This optimization is a fine-tuning of the net list to achieve the goal.

ME(1653, 1637): Final Schematics Floorplan, Placement and Timing Optimization:

The input to this milestone is the final schematic. Having this schematic enables the ECAD system to do a final floor planning of the system. Also optimization is achieved by placing elements close to each other.

ME(1653, 1639): Chip Timing Implementation:

The result from the previous milestone is a final chip timing implementation.

ME(1653, 1641): Critical Path Optimization and Layout:

This milestone represents further critical path analysis and layout. At this stage the layout has been created. The critical can depend on wire delays in the layout. Therefore, in this milestone the developer used the layout to optimize the critical path. The completion of the optimization by layout results in the final chip layout.

ME(1653, 1643): Chip(s) Layout Test Generation:

Having a finished chip layout (the sequence of the flip-flops, etc.) and the design for test from the design stage, it is now possible to do test generation, for example for scan testing.

ME(1655, 1629): Block Definition and Behavioral Description:

Verification that the system functionality satisfies the goals specified in the specification.

ME(1655, 1631): System Constraints:

Verification that the system constraints as defined in the specification are met by the final design.

ME(1655, 1633): System Timing:

Verification that the timing goals are met and that timing convergence has been achieved.

ME(1655, 1635): Chip(s) Function:

Verification that the functionality of individual ASIC chips meet the specifications and constraints set out in the specification.

ME(1655, 1637): Chip(s) Timing Constraints:

A verification that the timing constraints placed on the each chip in the design is met.

ME(1655, 1639): Critical Paths:

A final look at the critical paths to determine that there are no critical paths which fail to meet the timing constraints.

ME(1655, 1641): Chip Level Logic Compared to Layout Polygons:

The final chip level logic is compared to the layout polygons to determine if the polygons correspond as expected to the chip level logic.

ME(1655, 1643): Test Coverage:

For each block decisions are made on whether to import an existing or whether to design it from scratch.

The transitions between milestones only allow progression from top to bottom and from left to right. Thus, to work towards the completion of a milestone, the milestone above or to the left must already have been completed. This monotonic progression from the upper left matrix element to the lower right matrix element ensures an orderly progression in the design of the system. Furthermore, the matrix provides the developer with a visual road-map of the design process. Looking at the matrix, the developer can instantly determine which milestones have been completed, which remain and which milestones can be completed next.

Figure 17:
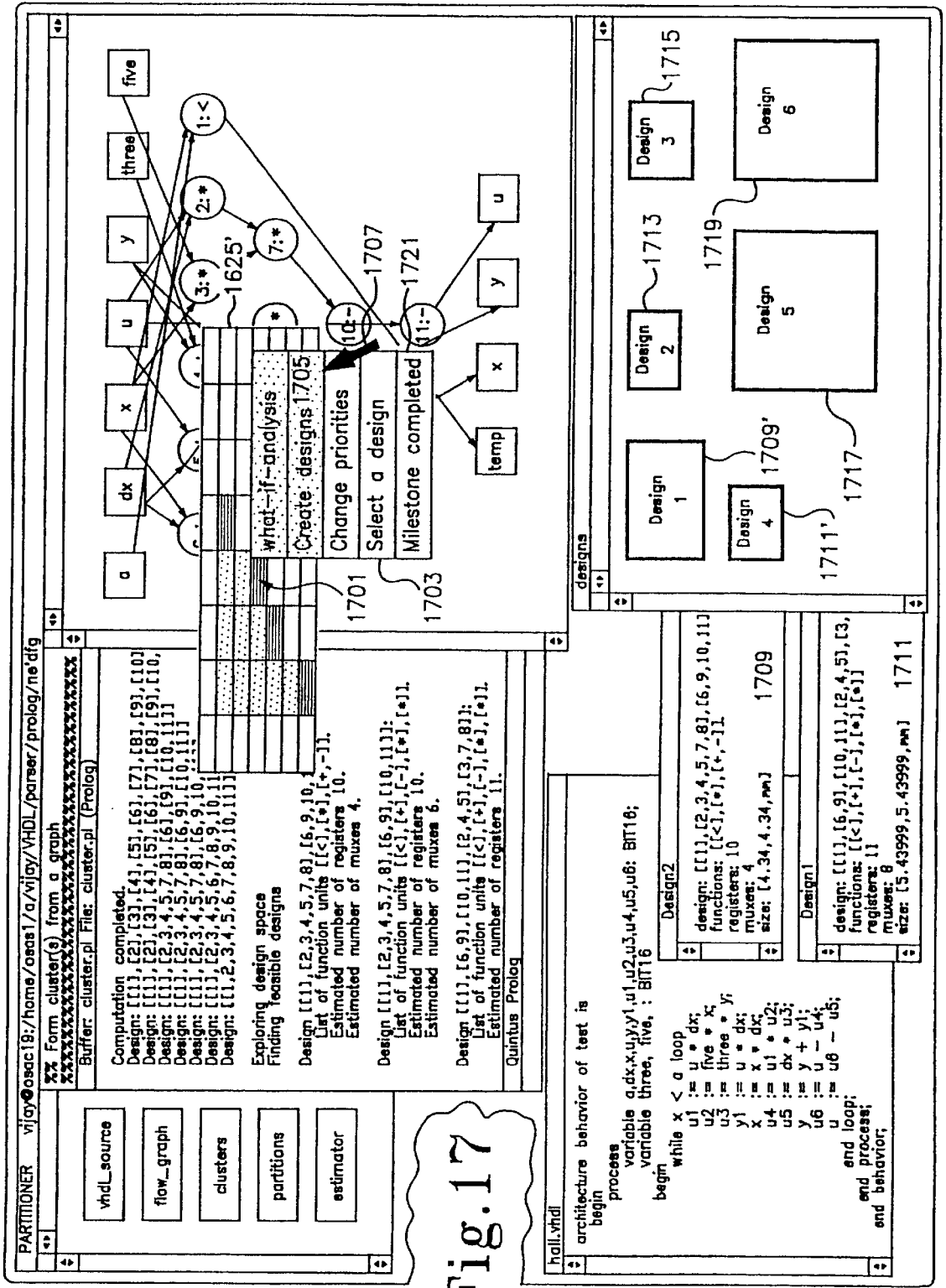
FIG. 17 is an exemplary screen display, similar to the display of FIG. 13, showing user interaction with a milestone matrix, such as that of FIG. 16b, according to the present invention.

FIG. 17 is a view of an iconic representation 1625' of matrix 1625 displayed on an ECAD system's graphic display device at an instance in the design process (Matrix 1625' is a version of milestone 1625 at a given instance in the development cycle.) This instance in the design process corresponds to the screen illustrated in and discussed in conjunction with FIG. 13. Matrix elements (1645, 1629), (1645, 1631), (1645, 1633), (1647, 1629), (1647, 1631), (1647, 1633), (1649, 1629), (1649, 1631) are highlighted or shaded to indicate that their corresponding milestones have been completed. Matrix elements (1645, 1635), (1647, 1635), (1649, 1633), (1651, 1631), (1651, 1629) are differently highlighted or shaded to show that their corresponding milestones may be worked on next. The developer has selected to work on the milestone corresponding to matrix element (1649, 1633) (the reference numerals refer to FIG. 16b. Matrix element (1649, 1633) is labeled 1701 in FIG. 17: the "What-if-analysis; System tradeoff analysis" milestone.

In the example of FIG. 17, the user of the ECAD system has caused a pop-up menu 1703 associated with milestone 1701 (corresponding to ME(1649,1633), FIG. 16b) to appear on a display unit. The user has further selected one of the menu items in menu 1703, the "Create designs" item 1705, by placing cursor 1707 over that item. The create designs menu item 1705 causes the architectural explorer tool (1831, FIG. 18) to be executed. Thus, in the example of FIG. 17, the selection of menu item 1705 has caused the alternative designs shown in windows 1709 and 1711 to be created. Additionally, several designs not explicitly shown have been created. The designs shown in windows 1709 and 1711, as well as other designs, are shown as items 1709' and 1711' and 1713–1719 in window 1713. By examining the results from architectural explorer tool, the developer may make a trade-of analysis of various designs.

Once satisfied with the results from the what-if-analysis, the developer may indicate the completion of the milestone by selecting "Milestone completed" menu item 1721. For certain milestones the developer uses his/her engineering judgment rather than executing specific tools or programs. For those milestones the associated pop-up menu contains only the "Milestone completed" menu item.

It is possible to consider the matrix of milestones as a sort of state-transition graph. Each state in the graph is the milestones which have been completed. Thus in the example above, the state is the completion of matrix elements (1645, 1635), (1647, 1635), (1649, 1633), (1651, 1631), (1651, 1629). The initial state is that "no milestones have been completed". Each activity which completes a next milestone is a transition in the graph, i.e., causing a transition to a new current state. The transition available from the first state is "complete system block diagram: This state is shown below:

$S_o$=elements completed: none
transitions available: "complete system block diagram"
The state represented by the example above is shown below:
$S_a$=elements completed: (1645, 1635), (1647, 1635), (1649, 1633), (1651, 1631), (1651, 1629)
transitions available: "partition logic and memory", "system data and control flow specifications", "what if analysis", "ASIC(s) Behavioral Design", "ASIC(s) RTL Design"

If the developer selects the "what if analysis" action and completes that milestone, the current state becomes:
$S_b$=elements completed: (1645, 1635), (1647, 1635), (1649, 1633), (1651, 1631), (1651, 1629), (1649, 1633)
transitions available: "partition logic and memory", "system data and control flow specifications", "ASIC(s) Behavioral Design", "ASIC(s)RTL Design"

The large number of possible states precludes discussion of each individually. Completion of certain milestones enables transitions independently of other milestones, whereas, certain other transitions require the completion of more than one milestone.

Thus, the transitions or actions available at any given point in the system design depends upon which milestones have been completed.

Figure 18:
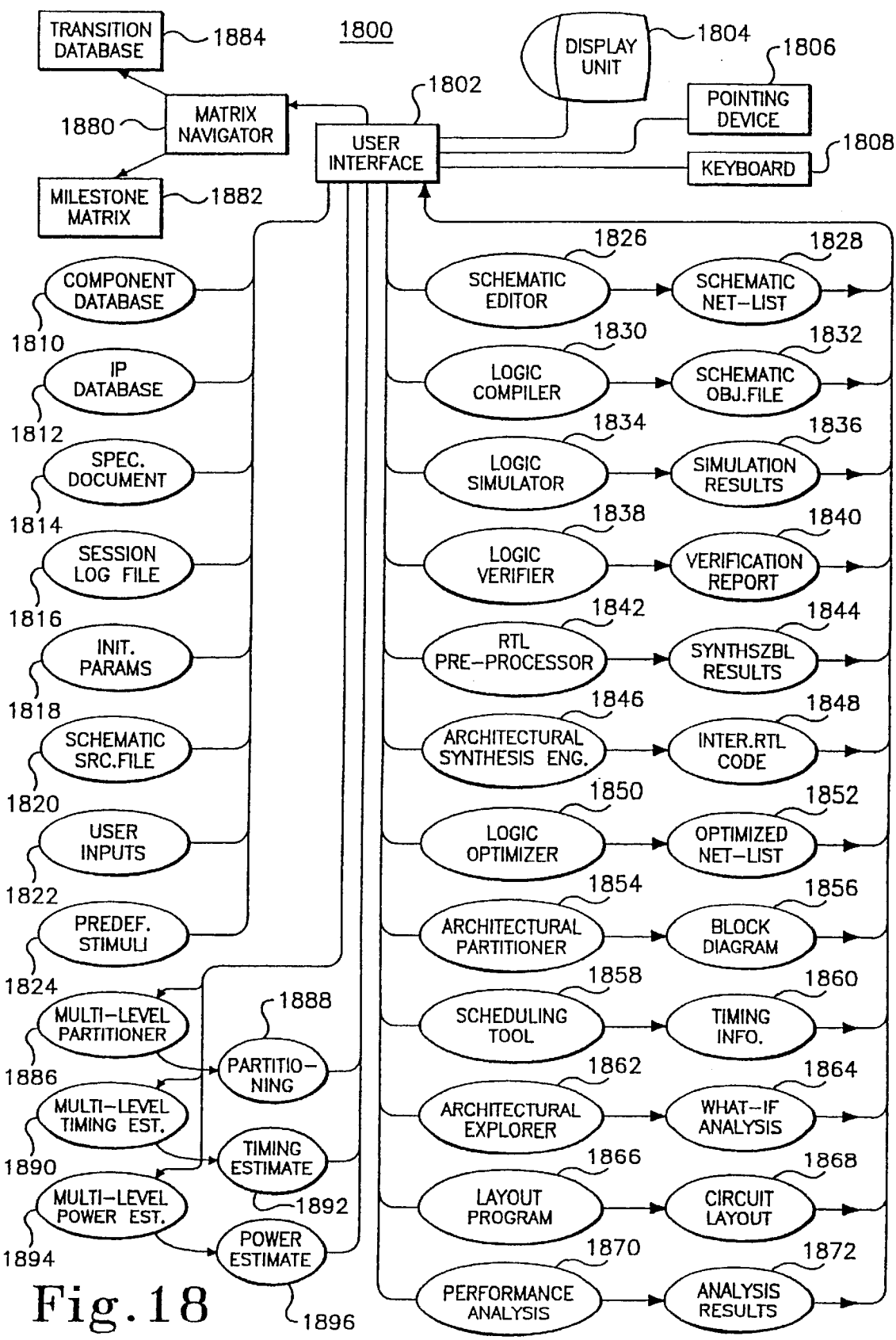
FIG. 18 is a block diagram of software modules (tools) operating in an ECAD system, according to the present invention.

FIG. 18 is a block diagram of an ECAD system 1800 according to the present invention. A user interface 1802 is connected to a display unit 1804, to a keyboard 1808, and to a pointing device 1810. User interface 1802 is further connected to a Milestone Matrix Navigator/Top-Down Enabler 1880. The Matrix Navigator 1880 is functionally connected to a milestone matrix 1882 (e.g., 1625 as shown and described with respect to FIG. 16b). The milestone matrix 1882 contains information about the various milestones in the particular design field. Milestone matrix 1882 also contains information about which milestones have been completed up to a particular point in time in the system development. The Milestone matrix 1880 can be implemented using one of many well-known types of data structures, e.g., as an array of records wherein each record has the fields: title, info, menu and completed_flag.

The Matrix Navigator 1880 is further connected to a transition database 1884 which contains information about the various actions which may be under taken depending on the various combinations of completed milestones. The transition database 1884 may be implemented in one of several methods. For example, in one embodiment, transition database 1884 is a list of transition rules including entries such as:

If matrix element a is completed and matrix element b is completed then enable transition x.

Alternatively, transition database 1884 can be keyed by the state of milestone matrix 1882 and stores the transitions available from the state. In another embodiment, in transition database 1884, only the currently available transitions are stored and this list is amended after the completion of each milestone to include or exclude any transitions available or not available due to the completion of the milestone.

The Matrix Navigator 1880 governs the progress through completion of the milestones of the Milestone Matrix 1882 according to the "rules" (state transition conditions) in the transition database 1884.

User interface 1802 is also connected to multi-level partitioner 1886. Multi-level partitioner 1886 enables a developer to partition a design based upon the information available at any given level. This is described in greater detail hereinbelow with respect to FIG. 19.

User interface 1802 is also connected to multi-level estimators 1890 and 1894. Multi-level timing estimator 1890 provides timing estimates 1892 using the parameters available at any given level of design abstraction. Similarly, multi-level power estimator 1894 provides a developer with an estimate 1896 of power dissipation of a design using the information available at any given level of design abstraction. It will appreciated by one of ordinary skill in the art, especially in light of the discussions hereinbelow, that other types of multi-level estimation capability, (e.g., area estimation) may also be similarly provided.

Resident within the ECAD system 1800 is a software system comprising a number of data structures and programs. Upon initial start-up, a schematic editor 1828 reads in a series of initialization parameters 1812 which set default mode selections and various configuration parameters. Said schematic editor may be the LSED editor by LSI Logic Corp. The schematic editor 1828 accepts input from a schematic source file 1820, displays its graphical representation on the ECAD system's graphical display unit 1804, and produces a schematic net-list 1828. If there is no existing schematic source file, it is assumed that a new schematic is being entered, and a blank entry sheet is presented on the display screen and a new, blank schematic source file 1820 and net- list 1828 are created. The schematic editor operates according to commands coming from user inputs 1822. Every command entered is recorded in a session log file 1816 such that the editor may undo any number of commands entered by the user. Some commands from the user inputs 1822 will be requested to place and interconnect schematic symbols on the display screen. To accomplish this, the schematic editor looks up the requested component(s) in a component database 1810 and retrieves graphical symbol representations of the requested component(s) contained therein. As the user enters the schematic diagram on the screen, the schematic editor creates a net list and invokes the function of a logic compiler 1830 to produce a schematic object file 1832.

A logic simulator 1834 operates on the schematic object file 1832 and component simulation parameters contained in the component database 1810 according to a set of initial conditions and/or signal conditions specified as pre-defined stimuli 1824.

For standalone operations, simulator 1834 may also operate off of user inputs 1822. The logic simulator may be the LSIM logic simulator produced by LSI Logic Corp.

A logic verifier 1838, performs design-rule checking of the schematic diagram captured by schematic editor 1826 by checking the components and their interconnections contained in the schematic object file 1832 against component interconnection and loading rules stored in the component database 1810, and produced a verification report 1840.

A layout program 1866 produces a layout 1868 by placing components and routing their interconnections on a semiconductor chip. After completion of the layout, the schematic source file(s) 1820, schematic net-list 1828, and schematic object file(s) 1832 are updated with information about placement location, placement orientation, and placement induced electrical characteristics.

Other tools and data structures (described in greater detail elsewhere herein) in an ECAD system according to the present invention include (but are not limited to):

- an architectural synthesis engine 1846 producing intermediate RTL code 1848;
- a logic optimizer 1850 producing an optimized net-list 1852;
- an architectural partitioner 1854 producing (a data representation of) an architectural block diagram 1856;
- a scheduling tool (scheduler) 1858 for assigning functions to particular clock cycle time slots, and producing timing information 1860 for subsequent binding;
- an architectural explorer 1862 for iteratively generating trial architectural designs, and yielding a "what-if" analysis 1864 to permit a user to select from a number of trial architectures; and
- performance analysis tools 1870 for simulating and estimating the performance of various aspects of the design (e.g., power consumption, speed, size, timing, etc.), and producing performance analysis results 1872.

Many of the tools and output files listed above are described in greater detail in patent application, Ser. No. 07/507,201 filed Apr. 6, 1990, (now U.S. Pat. No. 5,222,030; issued Jun. 22, 1993), incorporated by reference herein.

CONSTRAINT DRIVEN PARTITIONING OF BEHAVIORAL DESCRIPTIONS

A significant part of the design of an electronic system is the partitioning of the system into two or more sub-functions which are then each considered separately. The motivation for design partitioning is similar from the point of view of both the human system designer and the computer aided design (design synthesis) system. From the human system designer's point of view, it is convenient to break up a system into smaller, more tractable pieces so that it is not necessary to consider the overwhelming set of design choices to be made for the entire system design all at once. Similarly, for computer-based design synthesis systems, the optimization (or even completion) of the computational tasks associated with synthesis of a large design can rapidly become an unwieldy proposition. The computational complexity is dramatically reduced by partitioning the system design into a number of smaller design blocks associated with correspondingly smaller, isolated, computational problems.

At early design stages (e.g., at the system, behavioral, or algorithmic level of design) design partitioning involves architectural choices. The results to be achieved by the system being designed are known, but architectural partitioning choices determine the method and structure by which the results will be achieved. These architectural choices can have a dramatic impact on circuit complexity, bus width, chip area, number of I/O pins required, power dissipation, package selection, system cost, system timing, technology selection, etc. Often, there are design constraints associated with many of these areas. For example, in the design of a portable, battery-operated system, constraints on size, cost, and power consumption are of paramount concern. Since architectural choices (made in partitioning the design) can impact these areas, it is important to ensure that any architectural choices made do not violate the constraints of the design. Unfortunately, many design constraints (such as those mentioned above) are usually specified at a relatively low level (e.g., maximum power dissipation, size, target product cost, etc.) for which high-level architectural impact is difficult to determine without a great deal of insight into the rest of the (lower level) design process.

In many cases, the impact of architectural choices with respect to low-level design parameters (e.g., package type, cost, size, power, etc.) does not become evident until a considerable amount of effort has been expended in expanding (completing) the design according to the selected architecture. This results in a long iterative process whereby selection of an architectural partitioning scheme from one of several possible schemes is accomplished by "designing" the system according to each scheme separately, examining the results for compliance with design constraints, and selecting the architectural partitioning scheme which best meets the constraints. This iterative process, whether manual or automated, can be very time-consuming, as it involves a significant amount of "wasted" design effort on the architectural partitioning schemes which are not selected.

Clearly, a method of rapidly assessing or estimating the low-level impact of high-level architectural choices would have significant benefit in avoiding needless lengthy exploration of multiple architectural alternatives. Such a method would permit a system designer to make intelligent, informed high-level (architectural) design choices and to perform feasibility checks on various architectural partitioning schemes without going through time consuming (lower level) RTL synthesis and simulation.

In present systems, automated partitioning is provided primarily as an aid to floorplanning, layout, and signal routing, and operates at a net-list level, late in the design process. At this point in the design process, architectural choices and functional partitioning have long been completed and fixed, usually in a manual process by a system designer. If, for example, floorplanning and layout functions determine that too much chip area is required by the system design, the system designer's only choice is to return to the upper levels of design (e.g., behavioral or algorithmic), to make new architectural choices, and to try again.

So-called "graph" partitioning is a well-defined approach to automated floorplanning and layout, and a number of graph partitioning schemes have been applied to net-list partitioning. Other methods, such as module clustering and the Kernighan-Linn min-cut algorithm (and subsequent refinements thereof) are also very popular for use in placement and layout tools.

Most present partitioning techniques are directed to reducing the number of nets that cross from one partition to another, under some area constraints, thereby substantially isolating partitioned blocks from one another and simplifying the signal routing process. These techniques, however, do not take into consideration other constraints such as timing, power, package cost, and testability. Moreover, partitioning at the early stages of design (e.g., system or behavioral) is usually accomplished manually by the system designer by defining the different architectural modules in the system. If the architectural choices are not well made, some modules may "grow" disproportionately during the ensuing design process (possibly due to poor distribution of function), some modules may turn out to be overly "connected" (possibly due to poor isolation of function) or it may turn out that the original partitioning fails to meet other design constraints such as chip area or power dissipation (possibly due to poor choice of method and structure).

Furthermore, as logic synthesis tools improve, they tend to use and store greater amounts of information about each synthesized architectural block, thereby decreasing the maximum complexity of the largest architectural blocks that they can handle. This means that what the designer views as a "module" can easily be too complex for a logic synthesis tool. In accommodating and (as described above) the process of further partitioning the design manually can be either highly time-consuming (if many alternatives are investigated) or far from optimal (if poor choices are made).

According to the invention, automated high-level partitioning is performed as an integral part of the top-down design process. As a part of this process, a high-level description is partitioned and synthesized to meet the low-level designer-imposed constraints such as area, timing, power, etc.

It is well understood by those of ordinary skill in the art that different constraints can be interdependent, and that meeting one constraint (e.g., chip area) may violate another (e.g., speed). For any given design description and set of constraints, then, it is highly likely that a good architectural partitioning scheme cannot be achieved in a single computation cycle (pass). According to the invention, specific priorities set during the design and behavioral synthesis phases guide the partitioning process.

As an example, consider a case where the primary constraints are that the design must fit in a single chip and specific timing requirements must be met. In this case, minimization of the number of interconnections between architectural blocks (e.g., min-cut) is not a primary goal. However, interconnection complexity cannot be completely ignored because of on-chip routing problems which will arise if interconnection complexity becomes too great. On the other hand, it the design is to be partitioned into several chips then limitations on I/O pin count can cause interconnection complexity between the chips to have a higher priority. A generic set of tools aids the designer in evaluating the impact of different architectural choices to arrive at a suitable architectural partitioning scheme.

Given a high-level description and a set of constraints, the inventive technique synthesizes the blocks that make up the design (from the high-level description) and organizes (or distributes them) into multiple partitions. According to the invention, this is accomplished via iterative refinement to arrive at a partitioning scheme that meets the constraints (assuming that they can be met).

In a general sense, the process makes a first attempt at partitioning based on certain intrinsic information contained in the high level description of the design. If insufficient information is available at the high level in the design hierarchy, the process looks at lower levels (blocks) in the design hierarchy to obtain further information, and recursively attempts to make a valid partitioning. This technique of making initial estimations at a high level, and recursively evaluating lower level information to validate the estimations, is applicable to partitioning (as described in this section of the discussion), estimating timing (discussed hereinbelow), as well as estimating power/area requirements (also discussed hereinbelow) and determining the number of pins required by the device(s).

Generally, partitioning involves the organization or distribution of various elements of a design into discrete groups or partitions. In the context of a system, this may involve allocation of certain functions to certain discrete integrated circuit devices (chips).

Figure 19:
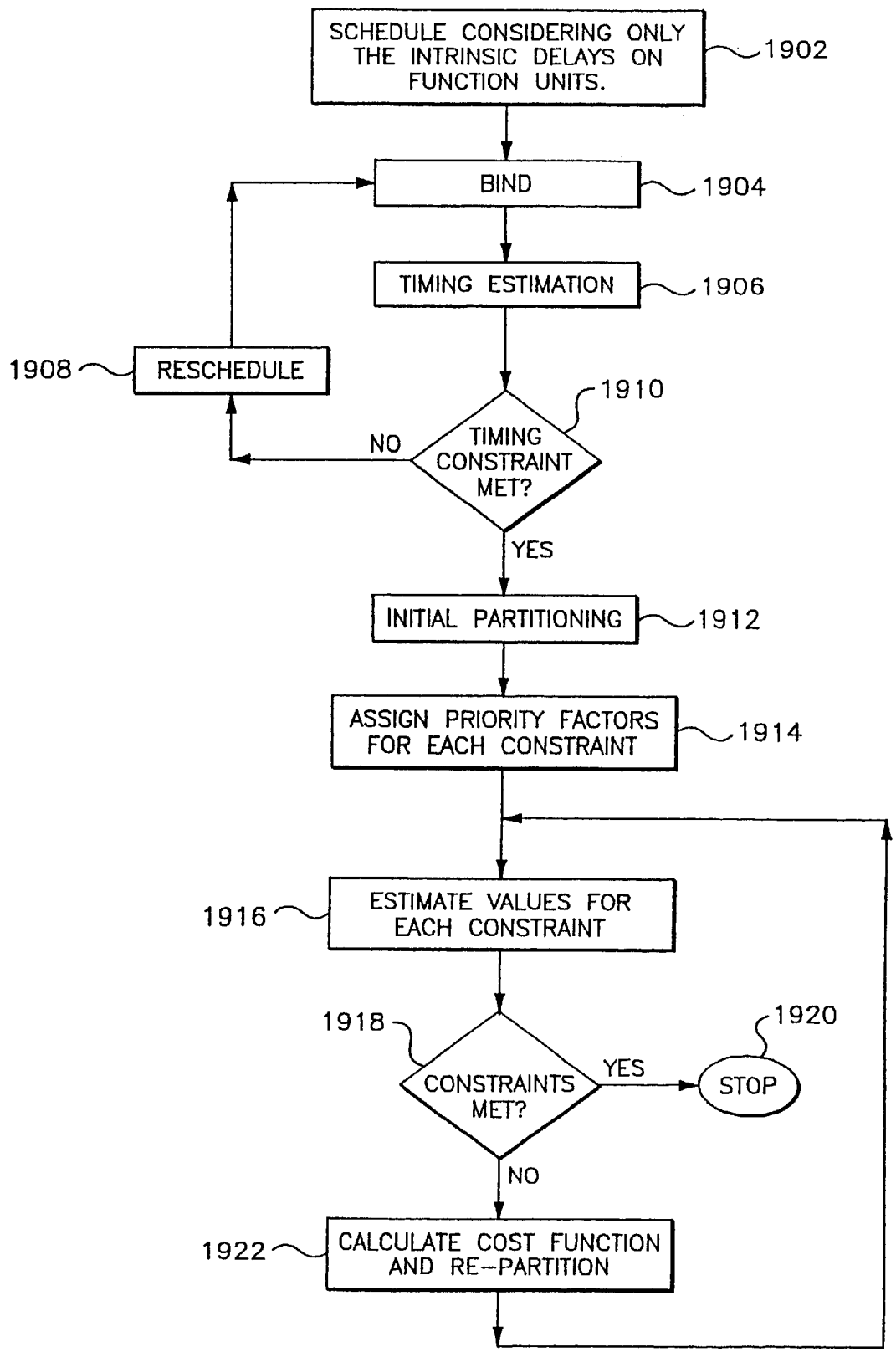
FIG. 19 is flowchart illustrating constraint-driven partitioning, according to the present invention.

FIG. 19 is a flow chart illustrating the data flow associated with a specific embodiment of the automated high-level partitioning technique of the present invention, in the context of a design of an integrated circuit chip. In this example, the inputs are constraints such as clock cycle, overall timing requirements for the design, maximum number of pins per chip, maximum bus width, maximum area for the chip, or any other constraint that the designer wishes to impose on the design. As a precursor to partitioning the design, the designer must prioritize the constraints. For example, the designer must decide whether timing considerations are more important than area limitations. The constraint priorities permit the partitioning technique to select between competing design strategies on the basis of relative importance of various aspects (relative to the constraints) of the outcome of those design strategies.

The first step 1902 in the partitioning process, initial scheduling, accounts only for any intrinsic delays on the (functional units) blocks in the design. These delays would be, for example, intrinsic to the parameters for the design specified in the high level (e.g., VHDL) description of the system, such as speed.

In a next step 1904, the design is "bound" by assigning registers and multiplexers to the various functional units of the design. At this point in the process, the design is flat (i.e., non-hierarchical).

As used herein, "scheduling" is the process of evaluating operations to be performed by the design and assigning them to specific clock cycle time slots. "Intrinsic delays" are delays associated with the functional units themselves and do not include the effects of signal path delays introduced by multiplexers and/or registers in routing signals to/from the functional units. Scheduling only deals with intrinsic delays of the functional units. "Binding" is the process of allocating and interconnecting (data structures corresponding to) blocks (functional units) to hardware units (e.g., macros, cores, mega-functions, etc.).

In a next step 1906, the timing of the bound design is estimated. Timing estimation at a high level in the design process is discussed in greater detail hereinbelow.

It is then determined, in a step 1910, whether the design meets timing constraints imposed at the high (e.g., behavioral) level description of the design. If the timing constraints are not met ("NO"), the design is re-scheduled, in a step 1908, this time taking into account the delays imposed by the muxes and registers, and the re-scheduled design is re-bound in the step 1904.

When the timing constraints are met ("YES"), the process proceeds to a step 1912, wherein the scheduled and bound design is initially partitioned, by applying a suitable constraint-driven clustering algorithm to the design, or the like. These constraints such as area, number of pins, and the like, which are defined by the user, may include other more "visceral" constraints such as the designer's experience-based intuition regarding the placement and juxtaposition of various functional units.

Next, in a step 1914, the process assigns a priority factor for each constraint. In other words, a priority factor "α", "β", "Γ", etc., is assigned by the designer to each constraint "a", "b", "c", etc., respectively. The ultimate partitioning of the design will take into account the weight of these priority factors wherein, for example, timing constraints may be given more weight than power dissipation. A typical cost function might have the form:

$$Cost = F(\alpha)*E(a) + F(\beta)*E(b) + \ldots + F(\gamma)*E(z)$$

where E(x) is an estimate of the associated constraint value "x" (e.g., area, power, timing, etc.) and F(p) is a function of a priority factor "p" (e.g., F(p)=2p; F(p)=p$^2$; F(p)=ae$^P$, etc.).

At this point, generally, the process iterates through checking whether the constraints are met, calculates a "cost function" based on the prioritization of the constraints, then seeks to minimize the cost function by moving functional units from one partition to another, or by adding redundant units to one or more partitions.

More specifically, by way of example, in a first step 1916, the process estimates values for each constraint. For example, for a power constraint, the techniques described hereinabove for estimating power are applied. Likewise, for a timing constraint, the techniques described hereinbelow for estimating timing are applied. It should, however, be understood that the partitioning technique of the present invention is applicable to any constraint deemed important by the designer.

Next, in a step 1918, it is determined whether all of the constraints have been satisfied ("YES"), based on their estimated values. If they have been satisfied, the process terminates (1920), having produced a valid partitioning of the design.

If, on the other hand, the constraints have not been met ("NO"), it is necessary in a next step 1922 to calculate the value of a cost function for the partitioning, and subsequently repartition the design so as to minimize the cost function.

In the description above, the iterative partitioning is accomplished along with and in cooperation with the scheduling and binding process, effectively at the Feasibility stage of design. The advantage of partitioning at this time is that the system can perform trade-offs between more optimal scheduling and binding and the partitioning. This cannot be done later in the design process because the binding will already have been fixed, and the ability to re-allocate/re-schedule and share resources will have been lost. For example, consider the case where timing is the most important constraint. In this case the system can investigate the advantage in adding redundant function units in order to reduce critical path lengths as long as the area constraints are still met. This cannot be done once the binding is fixed (the design is in the form of a net-list). Certain points related to this process of iterative partitioning to arrive at an optimal (or near optimal) partitioning of the electronic design (described with respect to the flow chart of FIG. 19) are summarized below.

Initially, a schedule is found considering only the intrinsic delays on the function units. After the binding stage, a high level timing estimator can determine if the synthesized design meets the user timing constraint. If the timing constraint is not met, the process is iterated this time with the additional information of the delays on the muxes and registers until a schedule and binding is found that meets the timing constraint.

The user prioritizes the constraints (for example, defining timing compliance as being more important than chip area). Estimates of the transmission delay between the partitions (i.e. inter- or intra-chip delays) are made. (These delays can be automatically estimated based upon a set of rules or statistics).

Assuming, for example, that timing is the highest priority constraint, the system considers the critical paths in the design. Note that these paths are not all the regular paths in the corresponding net-list since some paths do not correspond to the execution of the synthesized description. For each path the 'slack' is recorded and those paths for which the 'slack' is less than the inter-partition delay are marked as critical. A (configurable) percentage of all paths (sorted by the 'slack') is also marked and weights are assigned to each path according to 'criticality'.

At this point, the design description is partitioned based upon the weights on the paths (or the nets in the paths). Once an initial partition exists, an iterative refinement procedure optimizes the partitioning by repeated scheduling, binding, movement of units between partitions, and adjusting the parallelism of the design.

When an area constraint is at the highest priority, the initial clustering and partitioning assign more weight to preserving minimal numbers of functional units, while seeking to meet other constraints such as pin and timing.

In all iterations, the partitioning scheme provides partial binding information. This information is used at each stage to evaluate the new timing (and/or area and/or power, and/or pin-count, etc.) against other previous partitioning/scheduling/binding attempts, and to reschedule the design.

Once a partition that satisfies all the constraints is found, the partitioning information is appended to the system database and is used by RTL code generator to produce the corresponding code. If no such partition is found, a partition that meets most of the constraints according to the priority levels is chosen. The information can be used at subsequent design stages (or levels) for further processing (e.g., the generation of RTL code or generation of a net-list).

Power Estimation

The problem of power minimization in integrated circuits (ICs) is becoming very important due to an increasing demand for portable computing and telecommunication devices, and a rapid increase in the number of functions that can be accommodated on a single chip.

Power dissipation of an integrated circuit (IC), such as an application specific IC (ASIC) is an important design consideration, especially when implementing circuits in complementary-metal-oxide-semiconductor (CMOS) technology. In CMOS technology there are two components that contribute to power dissipation—namely:

1. Static (non-switching) dissipation—due to leakage current (static or DC current draw of "idle" gates or transistors).
2. Dynamic (switching) dissipation—due to:
   a. switching transient current
   b. charging and discharging of load capacitance In most CMOS ASICs the contribution due to static dissipation is small compared to dynamic dissipation. For example, the typical static power dissipation due to leakage for a CMOS inverter count, operating at 5 volts is between 1–2 nano-watts. Static dissipation for other logic families can be considerable. This is most notably true of bipolar logic families such as ECL (Emitter-Coupled Logic) and TTL (Transistor-Transistor Logic), and non-complementary MOS logic families (e.g., NMOS, HMOS).

For a given circuit design, the static power dissipation $P_s$ of a circuit is given by the equation:

$$P_s = \sum_{1}^{n} I_l \times V_{dd} \quad \text{(EQ 1)}$$

where $I_1$ is the leakage current (static current draw) of a representative logic device (gate), $V_{dd}$ is the supply voltage and n is the number of logic devices (gates) in the circuit. In general, static dissipation can be determined for any logic family (technology). If static dissipation varies significantly from one device type to another within a logic family, or if different types of logic having different static dissipation characteristics are combined within a single circuit, then static dissipation totals can be computed separately for each of the device types and summed together to arrive at an overall static dissipation total for the circuit.

The dynamic power dissipation $P_{dG}$ for a CMOS logic gate is given by the equation:

$$P_{dG} = \frac{1}{2} \times C_L \times V_{dd}^2 \times \frac{N_t}{T} \quad \text{(EQ 2)}$$

where $C_L$ is the output load capacitance on the gate, $V_{dd}$ is the supply voltage, T is the clock cycle and $N_t$ is the number of switching transitions per clock cycle. This is based on the well known principle that the bulk of CMOS operating current derives from charging and discharging of parasitic capacitances during logic level transitions. These parasitic capacitances are due primarily to input capacitances of subsequent logic gates and to parasitic wiring capacitances within the circuit (e.g., on a semiconductor die).

Thus, for a gate switching at the frequency $f$, we got the familiar equation:

$$P_{dG} = C_L \times V_{dd}^2 \times f \quad \text{(EQ 3)}$$

The total dynamic power dissipation $P_d$ of a CMOS circuit is given by the equation:

$$P_d = \frac{V_{dd}^2}{2T} \times \sum_{1}^{n} C_{Li} \times N_{ti} \quad \text{(EQ 4)}$$

where $C_{Li}$ is the load capacitance on the $i^{th}$ gate, $N_{ti}$ is the number of transitions of the $i^{th}$ gate per clock cycle, and n is the number of gates in the circuit. Equations 3 and 4 above are specific to CMOS devices, but are representative of the more general process whereby total dynamic power dissipation for a logic circuit can be calculated by summing the dynamic power dissipation contributions of each of the logic devices in the circuit. This more general process is applicable to any logic family or technology.

The total power dissipated by a circuit is the sum of the two components, static dissipation $P_s$ and dynamic dissipation $P_d$, as follows:

$$P_{total} = P_s + P_d \quad \text{(EQ 5)}$$

Simulation-based techniques for power estimation typically require input stimulus patterns (vectors) for the circuit, and a circuit simulator capable of identifying which devices are on and/or switching as a function of time. Calculation of maximum and average power dissipation is done using equations 1–4 above by substituting best and worst-case device parameters, and by applying representative average-case and worst-case input stimuli to the circuit via the circuit simulator. Circuit simulators such as SPICE are used to calculate the power dissipation of a circuit accurately for a given set of input stimuli. Since SPICE operates at the transistor level and uses iterative techniques to converge to a solution, simulation run times for SPICE simulations can be very long, potentially unacceptably long even for circuits of modest size.

Other simulation-based power estimation techniques use a switch or gate level simulator. LPOW is an example of a tool available from LSI Logic, Inc. which uses a gate level simulator to estimate power dissipation. The main limitation of these methods, again, is the need for a complete design (circuit or net-list) and complete simulation test pattern for at least all the typical cases expected to cause maximum (and representative average) power dissipation.

More recently, techniques are surfacing and being investigated which combine simulation and probability theory. These techniques reduce the problem of estimating average power in combinational circuits to one of computing signal probabilities of a multilevel circuit derived from the original circuit by a process of symbolic simulation. These techniques significantly reduce the burden of power estimation by effectively eliminating the need for complete sets of simulation stimuli (vectors), but still require a complete net-list for the circuit.

Most present power estimation tools operate at the net-list and/or layout level (i.e., late in the design process). However, such levels of design detail are generally not available to the designer early in the design process. For example, in the techniques described hereinabove with respect to FIGS. 1–15, the design is initially described at very high, behavioral levels.

Factors which the designer needs to take into account for accommodating and minimizing power consumption include junction temperature, packaging, cooling and circuit architecture. Making these changes after a design is complete is very expensive, time consuming and, at times, impossible.

It is therefore an object of the invention to provide a technique for estimating power consumption at an early stage in the design process, for example at a stage in the design process when a detailed global net-list and/or a layout for the circuit being designed is not available (e.g., does not yet exist).

It is a further object of the invention to provide a technique for estimating power dissipation in CMOS circuits which may be employed by the designer during different stages of the design process ranging from the system level to the net-list and layout levels.

According to the invention, a technique is provided to predict power dissipation as the design progresses through various stages from system level specifications, through behavior and RT level specifications and finally to the net-list and layout levels. This method for power estimation can be used in conjunction with estimators for other parameters in the design such as area and timing in high-level and RT-level synthesis systems for optimizing power consumption while considering other related constraints including system size, speed, IOs etc.

The techniques of the present invention enable the designer to consider, compute and accommodate various parameters, helping him to make intelligent, informed design decisions. Some of these parameters are:

junction temperature for the die, which affects circuit propagation delays and performance packaging for the die, which will affect and/or accommodate heat dissipation cooling measures, such as heat sinking, which may be considered when designing the board circuit architecture, which may be changed to reduce power consumption As noted hereinabove, with respect to FIGS. 1–15, a design typically goes through successive stages of refinement, starting from system level specification, behavior description, RTL description, through net-list and layout descriptions. At each stage, estimates for a number of important design parameters such as size, timing, and power are highly desirable.

The techniques of the present invention enable the designer to estimate power dissipation for an electronic design at the early stages of the design process, for example at the system level and at the behavior level.

Power Estimation at the System level

At the system level, only a high level, semantic description of the circuit (system) is available. The average power consumption is estimated using statistical models that take into account critical parameters. These parameters are either explicitly available or deduced from the system specifications. The following are exemplary of these parameters:

1. Number of gates, $N_g$
2. Number of I/O pins, $N_p$
3. Output Capacitance, $C_o$
4. Frequency of operation for the circuit/system, $f_s$
5. Interconnection pitch $P_w$
6. Interconnection Layers $N_w$
7. Utilization efficiency of interconnections, $E_w$
8. Average interconnection length, $l_{av}$
9. Average fanout of gates $F_w$
10. Total Chip Capacitance $C_c$
11. Average power consumption per gate in the given technology, $P_{dG}$ Power estimation at the system level does not require that all the parameters (1–11) listed above be supplied. Some of these parameters can themselves be estimated from other parameters provided by the designer. For example the average interconnection length $l_{av}$ can be estimated using the number of logic gates on the chip and Rent's rule as shown below (equations 6–8):

$$\bar{R} = \frac{2}{9} \times \left(7 \cdot \frac{n_g^{p-0.5} - 1}{4^{p-0.5} - 1} - \frac{1 - N_g^{p-1.5}}{1 - 4^{p-1.5}}\right) \frac{1 - 4^{p-1}}{1 - N_g^{p-1}} \quad \text{(EQ 6)}$$

$$d_g = \frac{f_g \bar{R} p_w}{\varepsilon_w n_w} \quad \text{(EQ 7)}$$

$$l_{av} = \bar{R} d_g \quad \text{(EQ 8)}$$

Based on the logic gate pitch R and other technology parameters listed above, the total chip capacitance $C_c$ can be estimated. The total (dynamic) power consumption for the system can then be estimated using the equation:

$$P_t = \tfrac{1}{2} f_c f_d C_c V_{dd}^2 \quad \text{(EQ 9)}$$

Using a combination of statistical techniques and analytical equations, representative ones of which are shown above, a good estimate for power can be derived at the system level. Since the total operating power $P_t$ for CMOs circuits is dominated by the dynamic power dissipation $P_d$, the static power $P_s$ need not be further considered. For logic families (technologies) which do exhibit significant contributions of static dissipation $P_s$ to total power dissipation $P_t$, the static dissipation factor is included in the total power dissipation (see equation 5 above). The accuracy of the power dissipation estimate depends significantly on the amount of information available from the system specification. Such preliminary power dissipation predictions can be used in making high level design decisions relating to system performance. At this early stage in the design process, it is not the absolute numerical value of the power dissipation estimate, but the qualitative nature of the estimate that allows the designer to make intelligent design decisions. Hence, accuracy may, at times, be sacrificed for computational speed and simplicity.

Power Estimation at the Algorithmic (functional), Behavioral and Register Transfer Levels After a first level of design whereby the system-level description of the electronic design (circuit or system) is expanded, more information is available (e.g., a behavioral description and first-level design choices) as compared to what was available at the system level of specification. (Alternatively, the electronic design may be initially specified at a lower-than-system level, e.g., behavioral or functional level). However, the system level power estimation techniques described hereinabove are applicable at lower (hierarchical) design levels, as well. Even so, the next-level (e.g., behavioral or RT) methods described hereinbelow make better use of the additional design information available at this next stage of the design process.

The method makes use of a behavioral or architectural synthesis system, such as that described hereinabove with respect to FIGS. 1–15. A description of the system or circuit at the behavioral level, (e.g., in a hardware description language (HDL) such as VHDL) is used as a starting point. In addition to this description, other system parameters (e.g., $N_g$, $N_p$, $C_o$, etc., listed above) are either obtained from the designer or have been determined or estimated in the first level (system level) of design.

The power estimation process proceeds as follows:

1. The design description (e.g., VHDL description) is analyzed to extract the control and data flow (thereby separating computational and data routing elements from control elements such as state machines which govern the sequence of computation and data routing). A CDFG, or Control and Data-Flow Graph (more accurately, a linked data representation of control and data flow within the design which can be graphically displayed or printed as a CDFG) is derived from this analysis.

2. Several trial "designs" are created by constructing one or more register transfer level designs, using architectural synthesis (e.g., as described hereinabove) and a library of available arithmetic, control, logic, interconnect and storage modules in the given technology. These trial "designs" exhibit different chip area and speed characteristics which are used in a trade-off analysis to determine the most appropriate design choices given known design constraints.

3. "Internal" power consumption (excluding I/O pin drivers) is estimated for each of the trial "designs" by summing contributing factors. Power data (parameter-dependent and/or absolute) related to dissipation by "core" cells, arithmetic modules (e.g., adders, subtracters, multipliers), interconnect elements (e.g. muxes), and storage elements (e.g. Flop flops, RAMs, ROMs) is determined from data stored in the library along with the RT descriptions of these circuit elements. Total power dissipation for the library modules (circuit elements) is computed taking into account operating frequency, fan-outs and output loads. Additional relevant information, such as the number of gates, number of pins and size for each element is either read in or is estimated. A fast floorplan (rough-cut) is constructed to compute the average interconnect length from which the average interconnect capacitance is estimated. The control logic size and associated power dissipation is estimated from the number of states in the design (either explicitly stated in or derived from the design description) and the complexity of boolean equations activating elements of the data path in the circuit. All contributing power dissipation factors are summed to obtain the total power dissipation inside the circuit.

4. The power dissipation due to output drivers (I/O pin drivers) is added to the internal power dissipation value computed in step 3 above to get the total power dissipation.

Automatically repeating the above procedure and tabulating the results across several different trial "designs" provides upper and lower bounds on power dissipation related to the various trial "design" choices.

This method for power estimation can be used in a high level synthesis system (such as that described hereinabove with respect to FIGS. 1–15) for optimizing power consumption while performing other high level tasks such as partitioning, behavior preserving, arithmetic transformations, and synthesis tasks such as scheduling, module selection and binding (each described in greater detail elsewhere herein).

Power Estimation Summary

In summary, the present invention provides a methodology for estimating power at the high levels of the design process viz. the system, algorithmic, and behavior levels. The motivation stems from the fact that system designers need an estimate up front even before starting an actual ASIC design to make high level decisions on performance, selection of die size, technology, and package, and to determine any appropriate cooling requirements while designing the system. The disclosed methodology uses a statistical-analytical method for power estimation at the system level and a combination of these and architectural synthesis techniques for estimating power at the algorithmic (functional) and behavioral levels.

High Level Area Estimation

As indicated above, in the discussion of FIGS. 1–15, in the process of designing digital circuits or systems, the artifact (e.g., circuit, system, or the like) being designed goes through a series of steps starting from the idea or conceptual level, all the way down to the layout or mask level. The design typically goes through successive stages of refinement, starting from system level specification, behavioral description, RTL description, through net-list and layout descriptions. At each stage in the design process, the circuit specification is refined and constrained to lie in a portion of the design space with respect to relevant parameters, a few of which are area, speed, power and cost. Often, design decisions impact one or more of these parameters, and the designer relies on "guess-timates" to make the proper choices among various alternatives. The discussion hereinbelow is directed particularly to aiding the designer in making qualitative and quantitative decisions relating to area.

It is an object to provide a multi-level area prediction (estimation) method for use at different stages of the design process, primarily targeted at early stages (higher levels) of the design process, namely at the system, algorithmic (functional), behavioral and RT levels.

According to the invention, methods are provided for computing area estimates at the system, behavioral and register-transfer levels. Area estimation at the system level, and at the behavioral, algorithmic and register transfer levels are treated separately hereinbelow. The methods use a combination of statistical, analytical and heuristic methods for area estimation at the system level, and use a combination of these methods and architectural synthesis techniques for estimating power at the algorithmic, behavioral and register transfer levels. The area estimation methods disclosed herein allow the designer to make high level decisions on total cost, selection of dies and packages, and other requirements, if any, while designing the board for a system. The disclosed methods for area estimation can be used in the high level or RT level synthesis system (see, e.g., the discussion hereinabove with respect to FIGS. 1–15) itself for optimizing total block or chip size, while performing high level tasks such as partitioning, behavior preserving arithmetic transformations and synthesis tasks such as scheduling, module selection and binding and technology mapping.

Area Estimation at the System Level

In many ways, area estimation is similar to power estimation, and relies on many of the same parameters. As stated hereinabove with respect to power estimation, only a high level description of the circuit or system is available at the system level of design. The total size (area) is estimated using statistical and analytical models that take into account certain critical parameters. The following are representative of these parameters.

1. Number of gates $N_g$
2. Number of I/O pins, $N_p$
3. Interconnection pitch, $P_w$
4. Number of interconnection layers, $N_w$
5. Utilization efficiency, $\epsilon_w$
6. Average interconnection length, $l_{av}$
7. Average fanout of gates, $F_w$
8. Number and size of memory elements (RAMs, ROMs, register files)
9. Number and size of buses As with power estimation, it is not necessary that all of the parameters be supplied by the designer; some of these parameters can be estimated from parameters either provided by the designer, inferred from other parameters, or derived from the specification (See, for example, the estimation of $l_{av}$ described hereinabove with respect to equations 6–8).

Again, for example, based on the logic gate pitch R and other technology parameters listed above, the logic area $A_c$ can be estimated by the following heuristic relation:

$$A_c = \sqrt{N_g} d_g \qquad \text{(EQ 10)}$$

Given the number of I/O pins and technology used for the design, the area required for I/O buffers is added to this model. If the system specification contains greater detail, such as the number of major blocks, the numbers of gates and pins per block, and the type of block (e.g., random logic, data path memory, etc.), appropriate size estimates targeted specifically to those types of blocks will be used instead of equation 10 to obtain the total logic area.

Routing area is a function of such design parameters as average fan-out, pins per net (signal), and average interconnection length, as well as target technology parameters such as interconnection pitch, number of interconnection layers, and utilization efficiency of interconnections. Using these parameters, the area required for routing of signal interconnections can be estimated and added to the logic area to obtain the total chip area.

As with power estimation, a combination of statistical techniques and analytical equations are used to derive an estimate for chip (or board) area at the system level. The accuracy depends on the amount of information available from the specification and the accuracy of the statistical/analytical models. Such preliminary area prediction can be used for making high level design decisions relating to system cost. Again, as with power estimation, the qualitative nature of the results are as important as or more important than the absolute numerical values in enabling the designer to make intelligent design decisions. Therefore, as with power estimation, it is possible to sacrifice accuracy in favor of computational speed or simplicity.

Area Estimation at the Behavior, Algorithmic, and RT Levels

Again, area estimation at the behavioral, algorithmic (functional), or RT level is very similar to power estimation at the same level. More information is available than is available at the system level of design. As with power estimation, system level techniques for area estimation are applicable here as well. As before, however, methods which make use of the additional design information available at this level are favored over the more approximate system-level techniques.

The method uses techniques similar to those found in behavioral or architectural synthesis systems. A description of the system or circuit (design description) at the behavioral level, described using a hardware description language (such as VHDL) is used as a starting point. In addition to this description, other system parameters (such as those listed hereinabove with respect to system-level area estimation) are obtained from the designer. The estimation process proceeds as follows:

1. The description is analyzed to extract the control and data flow from the design description. A CDFG "graph" of operations and values (more accurately, a linked data representation of the control and data flow in the design) is constructed from this analysis.
2. Using an architecture synthesis system (such as that described hereinabove with respect to FIGS. 1–15) and a library of available arithmetic, logic, interconnect and storage modules in the given technology, a number of trial RT-level "designs" are created.
3. Area is estimated for each of these trial "designs" by determining the number and type of modules (e.g., adders, subtracters, multipliers), interconnect elements (e.g., MUXes), and storage elements (e.g., Flip-flops, RAMs, ROMs) used. Information (either parameterized or absolute) related to the number of gates, number of pins, size and aspect ratio is stored in the library along with the description of each RT element. A rough floorplan is created for each trial "design" to determine the logic area required for the data path and control logic. The control logic size is estimated from the number of states in the system and the complexity of Boolean equation activating elements of the data path in the circuit. The routing area is estimated using parameters such as number of buses in the design, number of pins on the modules that need to be connected, the connectivity amongst modules, average interconnection length for the design, and a statistical measure of routing for the target technology. The logic and routing area are added up to obtain the total area of the circuit.
4. The area required for I/O pin buffers is added to the logic and routing areas computed in step 3 to get the total area required for each trial "design".

Automatically repeating the above procedure across several different trial "designs" provides upper and lower bounds on area for the behavioral, algorithmic (functional) or RTL design description.

This method for area estimation can be used in a high level synthesis system (such as that described hereinabove with respect to FIGS. 1–15) for optimizing total block, board or chip size while performing other high level tasks such as partitioning, behavior preserving, arithmetic transformations, and synthesis tasks such as scheduling, module selection and binding (each described in greater detail elsewhere herein).

Estimating Design Performance

Among the more critical determinations to be made in designing a digital electronic system is whether or not the timing of the system, as designed, will meet the design constraints. In order to accomplish this, it is necessary to obtain dependable information about the timing performance of the system being designed. The earlier in the design process that valid, reliable estimates of timing performance can be obtained, the earlier problems can be spotted and avoided. (It is well understood by those of ordinary skill in the art that early validation of design choices avoids a great deal of wasted effort.)

According to the invention, reasonable estimates of pin-to-pin timing and maximum operating frequency (minimum clock cycle time) can be derived from a behavioral description of an electronic system or from a block diagram description of the flow of the data in an electronic system.

A design of a digital electronic system, at any level, can be characterized using a block diagram. The block diagram can include function blocks representing components and the connections between them. Other blocks might represent the control elements governing the operation and flow of data in the electronic system. At the board or system level, the block diagram can include function blocks representing interconnected chips and electronic components. At the chip level the function blocks might represent cores, megacells, functional units (e.g., those assigned during "scheduling"), interconnect, and control logic. At the lowest levels of design hierarchy, the block diagram is representative of the net-list that connects the lowest level elements (components) of the electronic system design.

Finding the timing characteristics of a digital electronic system design, especially at the system or chip levels, is an important step in the design process. Current design tools only provide functional simulation (i.e., simulating logical function, but providing no useful detailed timing-related information) at higher levels of design abstraction, and the timing of the design is only found/verified at lower levels (e.g., RT level or logic level). Given a behavioral description or a block diagram that contains a description of the flow of data and control for an electronic system, and timing models for low-level design elements, we can estimate the timing at the higher level.

According to the invention, the description of the electronic system is converted to a CDFG (Control and Data Flow Graph) representation. Every component/block is represented by a node in the graph. Arcs (lines) between the nodes represent connections between the components/blocks (nodes in the graph). Each arc is annotated with the delay associated with the transfer of data between the components/blocks along the connection path associated with the arc. (If two nodes of the graph represent two physically different chips, then the "arc" delay can much more significant than delays along connections between blocks on the same chip.) These delays can be assigned or estimated based on the expected size of the design or on information extracted from a preliminary floorplan. Additional delays are added to arcs if data flow along the arc is dependent upon control logic timing.

(Note that since the inventive technique is directed to automated design tools, the terms "CDFG" and "graph" are intended to be representative of data structures on a computer system suitable for representing the "CDFG" or "graph", rather than literal references to a pictorial representation. For example, a "node" of a CDFG refers to a data item which identifies a component or block and can be used to refer to a timing model thereof. "Arcs" between nodes refer to data items which identify specific connections between nodes and which have one or more delay values associated with them. "Annotating" an arc with a delay value refers to storing a delay value in the data item for the arc.)

Each of the components/blocks that makes up the design has a timing model associated with it. Any data path (between an input pin and an output pin) through a component/block (i.e., a logic element represented by a node on the graph) can be characterized as having a "sequential", a "setup" component and an "output delay" component. The sequential component is the number of clock cycles required for a data change at the input (pin) of a data path to be reflected at the output (pin) of a data path. The setup component is the minimum amount of time before an active clock transition (i.e., a clock edge) that the data at the input (pin) must be stable in order to ensure proper recognition of the data by the sequential circuitry. The output delay component is the maximum delay time after the after the active clock transition before the data at the output (pin) of the data path changes. A minimum clock cycle time for the component/block represents the maximum operating clock frequency at which the component/block will function properly, and is stored within the timing model for the component/block. sequential, input setup and output delay timing information is stored for each of the data paths (input-pin to output-pin) through the component/block in the timing model for the component/block. This timing information can be stored in a matrix form. If timing information for a component/block does not exist the method described hereinbelow can be used to derive it and propagate it up to the higher level.

The nodes in the graph are then ordered according to the precedence relationship (in terms of data propagation sequence) described by the arcs and the data path timing information. This represents a high-level scheduling of the components/blocks in time. It is initially assumed that the maximum operating frequency (minimum clock cycle time) for the electronic system (represented by the graph) is the lowest maximum frequency (longest minimum clock cycle time) specified for any of the components/blocks.

Assuming no back edges in the graph, the pin-to-pin cycle count can be derived directly from the ordered graph. To derive the actual minimum clock cycle for the design, it is necessary to trace all of the data paths in the design and to ensure that no delay along a arc between sequential components exceeds that value (i.e., for an arc between an output pin of a sequential element and an input pin of a sequential element, the sum of output delay on the output pin, path delay along the arc, and input setup time for the input pin cannot exceed the minimum clock cycle time). This however, cannot be derived from the graph alone. The reason is that some paths in the design are not relevant to the functionality of the design. The behavioral or functional specification needs to be considered along with the graph. When the design description and the delays are both taken into consideration, a data path based static timing analysis produces a reasonable estimate of system timing performance.

The following is a detailed example of a method of deriving a synthesized RTL description from a behavioral code such that it obeys timing constraints. The method estimates the timing of a synthesized design and uses the estimate to re-synthesize until a design meeting the timing constraints is produced.

A high-level synthesis system (such as that described hereinabove with respect to FIGS. 1–15) performs scheduling and binding of a behavioral description in separate steps. In a scheduling step, function units are assigned to clock cycle time slots where only the intrinsic delay on the function units is taken into consideration. The operators that represent the behavioral description are not bound to actual functional units until the binding step. In the binding step, mutually exclusive operations can be assigned to the same functional unit (sharing). The binding algorithm seeks to minimize the number of different signals (or variables) that are input to the same functional unit, thereby saving on multiplexing costs (delay and area). However, most designs multiplexing the inputs to at least some of the functional units. The associated additional delay can result in an unacceptably long delay time along a scheduled register-to-register path (i.e., between sequential elements).

According to th e invention, high level timing estimates are used to determine minimal clock cycle time that will make the design function properly.

(Note that in the following discussion, the term "graph" is intended to refer to data representations of elements in the graph, rather than, literally, a pictorial representation.)

A graph is constructed from the Control and Data Flow Graph (CDFG) representation that is built by the High Level Synthesis (HLS) compiler in the following way:

1. For each operator in the CDFG create a node in the graph. Annotate each node with the intrinsic delay of the (register) unit to which it is bound.

2. Add arcs between nodes (i.e., between source and destination operators) that correspond to chained operations (i.e. , corresponding to data flow through the electronic system) . on each arc assign a weight corresponding to the delay on the input multiplexer (if any) to the functional unit to which the destination operator is bound.

3. Add zero weighted arcs between nodes that correspond to operators th at conditionally depend on each other (i.e., read-write, write-read, and write-write combinations).

4. Create two dummy nodes named "source" and "destination", and assign zero weights to both, referred to hereinafter as the source node and the destination node, respectively.

5. Each data arc that crosses a clock cycle line (in the CDFG) represents a store operation in the design. For each such arcs do the following:

5a. Create a node in the graph. Connect that node to the source of the arc. Annotate this node with the delay associated with the corresponding register. Attribute the arc with the delay of the multiplexer (if any) at the input to that register.

5b. Direct the output of this node to the destination node. Assign a zero weight to that arc.

5c. Direct a zero weight arc from the source node to the destination node of the original arc in the CDFG.

6. For each arc that flows from a port or a constant in the CDFG, connect a zero-weight arc from the source node to the arc's destination.

7. For each conditional operator: if the condition for its execution is computed in the same clock cycle then add an arc between the condition evaluation and the operator node in the graph, otherwise add an arc from the source node to the corresponding node. Define a global variable "cu" that stores the maximal delay through the control unit. Assign a reference to this variable as the weight on the arcs just created between the condition evaluation and associated conditional operators.

8. For each operator input that is multiplexed, add a similar arc (from the condition evaluation or source controlling the multiplexer). Assign an arc weight (delay) equal to the sum of cu delay and the multiplexer delay.

9. Determine the minimum clock cycle for the system according to the following algorithm:

Each node has an array Paths such that Paths[i] (the $i^{th}$ entry in the array) is the maximum accumulated delays along a path from this node to the destination node that spans i clock cycles. Initially Path[i]=$-\infty$.

The maximum "i" value for each node is recorded.

For each node from source to destination:
If not visited
   For each output arc:
     Let Child be the destination of the arc
     Find Longest Delay Path from Child to the destination node
     for each valid i
       let j be the path length in clock cycles for that path including This Node
     Paths[i] for this node=maximum of:
       Paths[i] for Child+Arc Weight+Weight for This Node
       or
       Paths[j] for This Node;
   Max for This Node=maximum of {Paths[i]/i}

As will be appreciated by one of ordinary skill in the art, the algorithm represents a path search from the source node to the destination node looking for delays which limit the operating frequency (clock cycle time) of the electronic system. Upon completion of the search, the maximum delay encountered defines the minimum clock cycle time.

In general, the process of synthesizing timing-correct designs can be summarized as follows:

1. Synthesize a behavioral description (e.g., using one or more of the techniques described hereinabove with respect to FIGS. 1–15)

2. Derive a timing estimate on the control unit part of the synthesized design ("cu" above).

3. Add the timing overhead to the functional units intrinsic delays and re-synthesize as necessary until timing constraints are met.

or

Derive a second synthesized design such that the requested timing is bracketed between the timing of the two designs and use binary search techniques to synthesize an optimal design.

As a result of this process a synthesized design is produced which stands a better chance of meeting the user-supplied timing constraints. The time required to verify timing constraint compliance at this early design stage (e.g., behavioral level) is significantly less then the time which would be required to iterate through several RTL and logic synthesis because of late-detected timing problems.

It will be evident to one of ordinary skill in the art that the techniques described hereinabove can be used to great advantage in providing significant automation of the process of designing electronic systems, including board level systems, custom integrated circuits, ASICs, PLD's, sequential controllers, etc. In particular, the techniques described hereinabove with respect to FIGS. 16a, 16b, and 17 are well suited to automated management and control of design activities large electronic design projects, providing an orderly, directed sequencing of those design activities, and ensuring that no steps are skipped or overlooked.

The techniques described with respect to FIG. 19 are well suited to automated optimization of large (or small) electronic design choices. These techniques permit iterative partitioning of an electronic design at any design stage, particularly at early stages of design (e.g., at the Feasibility stage) where it is possible to make trade-offs between major architectural approaches and partitioning choices without undue lost effort. These techniques rely on repeated estimation of various performance parameters (e.g., power dissipation, chip area, timing compliance, number of pins, size of package, etc.) and analyzing them according to user specified priorities against specified limits to select design choices (e.g., architecture, partitioning, parallelism, technology etc.) which yield an implementation which meets all design goals in as near optimal a fashion as possible. Specific techniques described herein provide methods of estimating power dissipation, area utilization, and timing compliance at any level of design abstraction.

It will be readily appreciated by one of ordinary skill in the art that application of these inventive techniques will produce more reliable, fully-tested, specification compliant electronic circuits and systems, without fewer errors and iterations than might otherwise be possible.

What is claimed is:

1. A method for mapping a behavioral description of a circuit design into a register transfer level description on an electronic computer aided design system, comprising the steps of:

establishing a design specification comprising a device specification;

creating a functional design description from said design specification;

partitioning the functional design into separate modules;

creating a register transfer level module description of the partitioned design; and reconstructing the design from the partitioned design.

2. The method of claim 1, further comprising the step of functionally verifying the system design after said reconstructing step.

3. The method of claim 1, wherein the partitioning step comprises the substeps of:

synthesizing the design into a target technology using the module description;

creating a description of the module produced by the synthesizing substep; and functionally verifying the structure of the module.

4. The method of claim 3, wherein the description creation substep comprises the substep of utilizing timing and area constraints to optimize the design.

5. The method of claim 4, further comprising the substep of structurally optimizing the design.

6. The method of claim 5, further comprising the substep of verifying and analyzing system design after said structural optimization substep.

7. The method of claim 5, further comprising a high level module structural describing substep following said structural optimizing substep.

8. The method of claim 7, further comprising the substep of composing optimized modules and implementing intended functionality of a high level module.

9. The method of claim 8, further comprising the substep of creating a floor planning placement and routing the design.

10. The method of claim 8, further comprising the substep of back annotating inter-block wiring delays.

11. The method of claim 8, further comprising the substep of introducing global constraints by defining inter-block timing constraints.

12. A system for providing an integrated system environment within an electronic computer aided design system for creating a design of an integrated circuit chip, comprising:
a memory;
a synthesis memory compiler for synthesizing said memory into a memory block comprising a netlist of primitive transistors;
a translator, which translates the memory block into data which may be read by a design compiler;
a modeler, which models mega cells and macro cells; and
an optimizer.

13. A system for providing an integrated system environment within an electronic computer aided design system for creating a design of an integrated circuit chip, comprising:
a plurality of mega-cells and mega-functions;
a modeler, which models mega-cells and macro-cells;
a netlist back plane; and
an optimizer.

14. A system for providing an integrated system environment within an electronic computer aided design system for creating a design of an integrated circuit chip, comprising:
a design compiler which provides an environment for synthesis and constraint driven optimization and synthesizes random logic;
a netlist back plane; and
an optimizer.

15. A method for designing an integrated circuit chip, comprising the steps of:
formulating a behavioral description of the design in a high-level language;
partitioning the behavioral description into architectural blocks;
synthesizing both structured and unstructured logic;
creating a netlist;
compiling and simulating the netlist; and
providing a structural description of the design to a target compiler.

16. A method of designing a circuit using an electronic computer aided design system, comprising the steps of:
formulating a description of the desired behavior of the circuit;
reformulating the circuit design description as a register-level transfer description of the circuit;
simulating the register transfer level description, wherein said simulating step equates to the behavioral description; and
minimizing simulated logic associated with the design.

17. A method of partitioning a design of an integrated circuit chip by imposing predetermined constraints, comprising the steps of:
initially scheduling intrinsic delays among functional units of the design;
binding the design by assigning registers and multiplexers to the functional units;
estimating timing for the bound design;
determining whether the design meets timing constraints;
establishing priority factors for said predetermined constraints;
estimating values for said predetermined constraints;
evaluating whether said predetermined constraints satisfy a predetermined criteria; and
calculating a cost function and repeating said value estimation and evaluation steps until said predetermined constraints satisfy a predetermined criteria.

18. A method for creating and validating a description of an electronic design, comprising:
specifying a desired behavior for the electronic design;
partitioning the electronic design into a number of blocks;
utilizing logic synthesis programs to provide a low-level description of the electronic design; and
estimating timing parameters for physical implementation of the electronic design.

19. The method of claim 18, further comprising the steps of:
creating a milestone matrix, wherein each matrix element represents an activity; and
upon completion of an activity, altering predetermined preceding and succeeding activities.

20. A method for creating a structural description of a circuit or device from a high-level design within a mutli-windowing graphical user interface (GUI) environment, comprising the steps of:
specifying a description of the high-level design in a behavior-oriented language;
partitioning the high-level design into a plurality of clusters;
performing a detailed physical floorplan of the design, wherein said physical floorplan is performed utilizing:
analysis tools to evaluate predetermined performance criteria; and
planning tools; and
iteratively evaluating and correcting the detailed physical floorplan based on analysis and physical design evaluation.

21. The method of claim 20, wherein said partitioning step comprises dividing the design into clusters satisfying predetermined constraints.

22. A system for creating a structural description of a circuit or device on an ECAD device, comprising;
a device for creating a behavior description of said circuit or device:
a logic synthesis tool for synthesizing circuit design on a structural level from said behavioral description; and
a floorplanning tool which feeds design information back to said logic synthesis tool to analyze and correct design deficiencies.

23. The system of claim 22 wherein the information comprises timing information.

* * * * *